US012672446B2

(12) United States Patent　　(10) Patent No.: US 12,672,446 B2
Son et al.　　(45) Date of Patent: Jun. 30, 2026

(54) DISPLAY APPARATUS

(71) Applicant: Samsung Display Co., Ltd., Yongin-si (KR)

(72) Inventors: Sunkwun Son, Yongin-si (KR); Donghee Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 324 days.

(21) Appl. No.: 18/441,872

(22) Filed: Feb. 14, 2024

(65) Prior Publication Data

US 2024/0324342 A1　　Sep. 26, 2024

(30) Foreign Application Priority Data

Mar. 24, 2023　(KR) ......................... 10-2023-0038979
Jun. 5, 2023　(KR) ......................... 10-2023-0072343

(51) Int. Cl.
　H10K 59/131　　(2023.01)
　H10K 39/34　　(2023.01)
　G06F 3/041　　(2006.01)

(52) U.S. Cl.
　CPC ........... H10K 59/131 (2023.02); H10K 39/34 (2023.02); *G06F 3/04164* (2019.05); *G09G 2300/0426* (2013.01); *G09G 2300/0819* (2013.01); *G09G 2320/0233* (2013.01); *G09G 2320/043* (2013.01); *G09G 2320/045* (2013.01); *G09G 2360/14* (2013.01)

(58) Field of Classification Search
　CPC ...... G06F 3/04164; G06F 3/32; G06F 3/3225; G06F 3/3233; G06F 3/3258; G09G 2300/0426; G09G 2300/0819; G09G 2320/0233; G09G 2320/043; G09G 2320/045; G09G 2360/14; H10K 59/131; H10K 39/34
　USPC ............................................ 257/72; 345/173
　See application file for complete search history.

(56) References Cited

U.S. PATENT DOCUMENTS

| 11,276,743 B2 | 3/2022 | Cho et al. | |
| 2007/0200832 A1 * | 8/2007 | Cho | G06F 3/04184 |
| | | | 345/173 |

(Continued)

FOREIGN PATENT DOCUMENTS

| CN | 110737126 B | 1/2020 |
| KR | 10-2022-0009562 A | 1/2022 |
| KR | 10-2022-0077323 A | 6/2022 |

*Primary Examiner* — Tom V Sheng
(74) *Attorney, Agent, or Firm* — Womble Bond Dickinson (US) LLP

(57) ABSTRACT

A display device includes a light-emitting diode in a display area and a pixel circuit electrically connected to the light-emitting diode, a photo diode in a light detection area overlapping the display area, and a light detection circuit electrically connected to the photo diode, a read-out line overlapping the light detection circuit and extending in a first direction, a vertical connection line extending in the first direction in the display area, a horizontal connection line extending in a second direction crossing the first direction in the display area, and connecting the vertical connection line to the read-out line, and a vertical voltage line extending in the first direction in the display area and having a width in the second direction greater than a width in the second direction of the vertical connection line.

20 Claims, 17 Drawing Sheets

(56)  References Cited

U.S. PATENT DOCUMENTS

| | | | |
|---|---|---|---|
| 2010/0194699 A1* | 8/2010 | Chang | G06F 3/0412 |
| | | | 345/173 |
| 2011/0310035 A1* | 12/2011 | Kim | G06F 3/0445 |
| | | | 345/173 |
| 2012/0038566 A1* | 2/2012 | Lin | G06F 3/042 |
| | | | 345/173 |
| 2020/0380918 A1* | 12/2020 | Cho | G09G 3/3258 |
| 2022/0019757 A1* | 1/2022 | Han | G09G 3/3233 |
| 2022/0173197 A1* | 6/2022 | Bang | H10K 59/131 |
| 2024/0324342 A1* | 9/2024 | Son | H10K 59/131 |
| 2024/0353951 A1* | 10/2024 | Song | G06F 3/04164 |
| 2024/0365614 A1* | 10/2024 | Lee | H10K 59/131 |
| 2025/0014525 A1* | 1/2025 | Song | G09G 3/3275 |
| 2025/0048874 A1* | 2/2025 | Lee | H10K 59/13 |

* cited by examiner

FIG. 9B

DISPLAY APPARATUS

CROSS-REFERENCE TO RELATED APPLICATIONS

The present application claims priority to and the benefit of Korean Patent Application No. 10-2023-0038979, filed on Mar. 24, 2023, and Korean Patent Application No. 10-2023-0072343, filed on Jun. 5, 2023, in the Korean Intellectual Property Office, the entire contents of which are incorporated by reference herein.

BACKGROUND

1. Field

One or more embodiments relate to display apparatuses.

2. Description of Related Art

An organic photodiode (OPD) absorbs incident light and converts the light into a current by using an organic semiconductor. A structure of the organic photodiode is very similar to a structure of an organic light-emitting diode (OLED). Each of these two elements includes two electrodes facing each other and a photoactive layer or an emission layer located between the two electrodes. By using the similarity in structure as described above, an OLED and an OPD may be arranged together in a display area of a display apparatus.

Lines for transferring an electrical signal to be transmitted to the OLED and lines for transferring an electrical signal generated by the OPD may be located in a peripheral area outside the display area.

SUMMARY

In display apparatuses, lines for transferring electrical signals to be transmitted to an organic light-emitting diode (OLED) are arranged, and thus, an arrangement area for existing lines may be reduced, and a difference in luminance between pixels due to a voltage drop may occur.

One or more embodiments include a display apparatus on which a high-quality image is displayed. However, the one or more embodiments are only examples, and the scope of the present disclosure is not limited thereto.

Additional aspects will be set forth in part in the description which follows and, in part, will be apparent from the description, or may be learned by practice of the presented embodiments of the present disclosure.

According to one or more embodiments, a display device includes a light-emitting diode in a display area and a pixel circuit electrically connected to the light-emitting diode, a photo diode in a light detection area overlapping the display area, and a light detection circuit electrically connected to the photo diode, a read-out line overlapping the light detection circuit and extending in a first direction, a vertical connection line extending in the first direction in the display area, a horizontal connection line extending in a second direction crossing the first direction in the display area, and connecting the vertical connection line to the read-out line, and a vertical voltage line extending in the first direction in the display area and having a width in the second direction greater than a width in the second direction of the vertical connection line.

The vertical connection line includes a plurality of vertical connection lines and the vertical voltage line includes a plurality of vertical voltage lines, and at least one vertical connection line of the plurality of vertical connection lines may be arranged between neighboring vertical voltage lines of the plurality of vertical voltage lines.

Two vertical connection lines of the plurality of vertical connection lines may be arranged between the neighboring vertical voltage lines of the plurality of vertical voltage lines.

The pixel circuit includes a driving transistor including a first terminal, a second terminal, and a gate connected to a first node, a data write transistor connected to the first terminal of the driving transistor and a data line, a first initialization transistor connected to the first node and a first horizontal voltage line, and a second initialization transistor connected to a pixel electrode of the light-emitting diode and to a second horizontal voltage line or a third horizontal voltage line, wherein the plurality of vertical voltage lines include a first vertical voltage line connected to the first horizontal voltage line, a second vertical voltage line connected to the second horizontal voltage line, and a third vertical voltage line connected to the third horizontal voltage line, and a vertical common voltage line.

The display apparatus may further include a horizontal common voltage line extending in the second direction in the display area and connected to the vertical common voltage line.

The horizontal connection line and the horizontal common voltage line may be on a first conductive layer, and the plurality of vertical connection lines and the plurality of vertical voltage lines may be on a second conductive layer that is on the first conductive layer.

The vertical connection line may be located to be farther away from an imaginary center line than a read-out line connected to the vertical connection line is, the imaginary center line dividing the display area into two equal areas and extending in the first direction.

The display apparatus may further include a data line extending in the first direction in the display area and connected to the pixel circuit, a vertical data connection line extending in the first direction in the display area, and a horizontal data connection line extending in the second direction in the display area and connecting the data line to the vertical data connection line.

The vertical data connection line may be located to be closer to an imaginary center line than a data line connected to the vertical data connection line is, the imaginary center line dividing the display area into two equal areas and extending in the first direction.

The display area may include a first area in which the horizontal data connection line is arranged, and a second area in which the horizontal connection line is arranged, and the first area and the second area may not overlap each other.

The pixel circuit includes a plurality of pixel circuits and the light detection circuit includes a plurality of light detection circuits, and at least two pixel circuits of the plurality of pixel circuits may be arranged between light detection circuits of the plurality of light detection circuits neighboring in the second direction.

Four pixel circuits of the plurality of pixel circuits may be arranged between the light detection circuits of the plurality of light detection circuits neighboring in the second direction.

The vertical connection line or the vertical voltage line may be arranged between two pixel circuits of the plurality of pixel circuits in contact with each other in the second direction.

The vertical voltage line may include a first portion having a first width and a second portion having a second width that is greater than the first width.

An area of the vertical voltage line may be two to four times an area of the vertical connection line.

The display apparatus may further include a plurality of first auxiliary common voltage lines extending in the first direction in the light detection area.

The vertical voltage line includes a plurality of vertical voltage lines, and at least one first auxiliary common voltage line of the plurality of first auxiliary common voltage lines may be arranged between neighboring vertical voltage lines of the plurality of the vertical voltage lines.

The vertical connection line includes a plurality of vertical connection lines, and the light detection area may include a first line area in which the plurality of first auxiliary common voltage lines are arranged, and a second line area in which the plurality of vertical connection lines are arranged.

Some first auxiliary common voltage lines of the plurality of first auxiliary common voltage lines may have the same extension axis as a corresponding vertical connection line, and may be spaced from the corresponding vertical connection line in the first direction.

The display apparatus may further include a plurality of second auxiliary common voltage lines each extending in the second direction in the display area, wherein some second auxiliary common voltage lines of the plurality of second auxiliary common voltage lines have the same extension axis as a corresponding horizontal connection line, but may be spaced from the corresponding horizontal connection line in the second direction.

These and/or other aspects will become apparent and more readily appreciated from the following detailed description of the embodiments, the accompanying drawings, and claims.

BRIEF DESCRIPTION OF THE DRAWINGS

The above and other aspects and features of certain embodiments of the present disclosure will be more apparent from the following description taken in conjunction with the accompanying drawings, in which:

FIGS. 9A and 9B are plan views schematically illustrating a portion of a display apparatus according to one or more embodiments;

DETAILED DESCRIPTION

Figure 1:
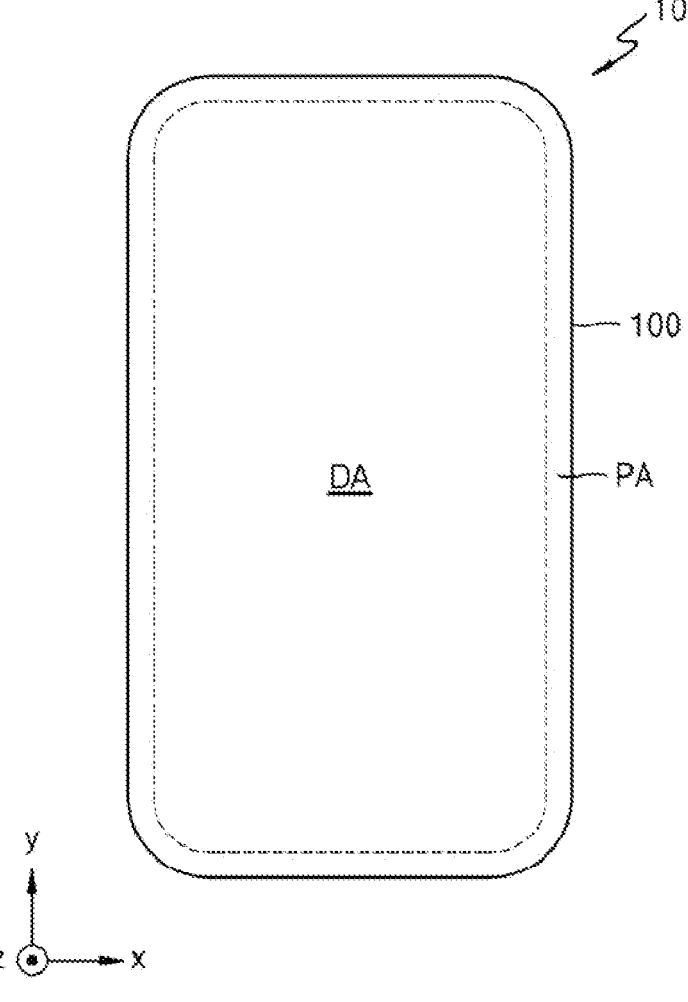
FIGS. 1 and 2 are plan views schematically illustrating a display apparatus according to one or more embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the present disclosure, the expression "at least one of a, b, or c" indicates only a, only b, only c, both a and b, both a and c, both b and c, all of a, b, and c, or variations thereof.

As the present disclosure allows for various changes and numerous embodiments, certain embodiments will be illustrated in the drawings and described in detail in the written description. Hereinafter, effects, aspects, and features of the present disclosure and a method for accomplishing them will be described more fully with reference to the accompanying drawings, in which embodiments of the present disclosure are shown. The present disclosure may, however, be embodied in many different forms and should not be construed as limited to the embodiments set forth herein.

Hereinafter, embodiments will be described with reference to the accompanying drawings, wherein like reference numerals refer to like elements throughout and a repeated description thereof is omitted.

In the present disclosure, terms, such as "first" and "second," are used herein merely to describe a variety of elements, but the elements are not limited by the terms. Such terms are used only for the purpose of distinguishing one element from another element.

In the present disclosure, an expression used in the singular encompasses the expression of the plural, unless it has a clearly different meaning in the context.

In the present disclosure, terms, such as "include" or "comprise," may be construed to denote a certain characteristic or element, or a combination thereof, but may not be construed to exclude the existence of or a possibility of addition of one or more other characteristics, elements, or combinations thereof.

It will be understood that when a layer, region, or element is referred to as being "formed on" another layer, region, or element, it can be directly or indirectly formed on the other layer, region, or element. That is, for example, intervening layers, regions, or elements may be present.

It will be understood that when a layer, region, or elements is referred to as being "connected" to another layer, region, or element, it may be "directly connected" to the other layer, region, or element and/or may be "indirectly connected" to the other layer, region, or element with other layer, region, or element therebetween. For example, it will be understood that when a layer, region, or element is referred to as being "electrically connected" to another layer, region, or element, it may be "directly electrically connected" to the other layer, region, and/or element or may be "indirectly electrically connected" to other layer, region, or element with other layer, region, or element therebetween.

In the present disclosure, "A and/or B" means A or B, or A and B. In addition, "at least one of A and B" means A or B, or A and B.

In the present disclosure, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When an embodiment may be implemented differently, a certain process order may be performed differently from the described order. For example, two consecutively described processes may be performed substantially at the same time or performed in an order opposite to the described order.

In the present disclosure, when X and Y are connected, it may include a case in which X and Y are electrically connected, a case in which X and Y are functionally connected, and a case in which X and Y are directly connected. Here, X and Y may be objects (e.g., devices, elements, circuits, lines, electrodes, terminals, conductive films, layers, or the like). Accordingly, a connection relationship is not limited to, for example, a connection relationship indicated in the drawings or the detailed description, and may include a connection relationship other than the connection relationship indicated in the drawings or the detailed description.

When X and Y are electrically connected, it may include a case in which one or more elements (e.g., switches, transistors, capacitors, inductors, resistors, diodes, etc.) enabling electrical connection between X and Y are connected between X and Y.

Sizes of elements in the drawings may be exaggerated or reduced for convenience of explanation. For example, since sizes and thicknesses of elements in the drawings are arbitrarily illustrated for convenience of explanation, the present disclosure is not limited thereto.

In the present specification, "ON" used in association with a state of an element may refer to an activated state of the element, and "OFF" may refer to an inactivated state of the element. "ON" used in association with a signal received by an element may refer to a signal for activating the element, and "OFF" may refer to a signal for deactivating the element. The element may be activated by a voltage of a high level or a voltage of a low level. For example, a p-channel transistor (p-type transistor) may be activated by a low-level voltage, and an n-channel transistor (n-type transistor) may be activated by a high-level voltage. Accordingly, it should be understood that "ON" voltages for a p-type transistor and an n-type transistor are opposite (low versus high) voltage levels.

In the present disclosure, when a signal is supplied, it may denote that an on voltage (e.g., a high-level voltage) is supplied, and when a signal is not supplied, it may denote that an off voltage (e.g., a low-level voltage) is supplied.

In the following embodiments, the x direction, the y direction, and the z direction are not limited to directions following three axes of the rectangular coordinate system, and may be interpreted in a broader sense. For example, the x direction, the y direction, and the z direction may be perpendicular to one another, or may represent different directions that are not perpendicular to one another.

A display apparatus according to one or more embodiments may be implemented as an electronic device, such as smartphones, mobile phones, smartwatches, navigation devices, game consoles, televisions (TVs), head units for vehicles, laptop computers, tablet computers, personal media players (PMPs), and personal digital assistants (PDAs). In addition, the display apparatus may be a flexible apparatus.

Figure 2:
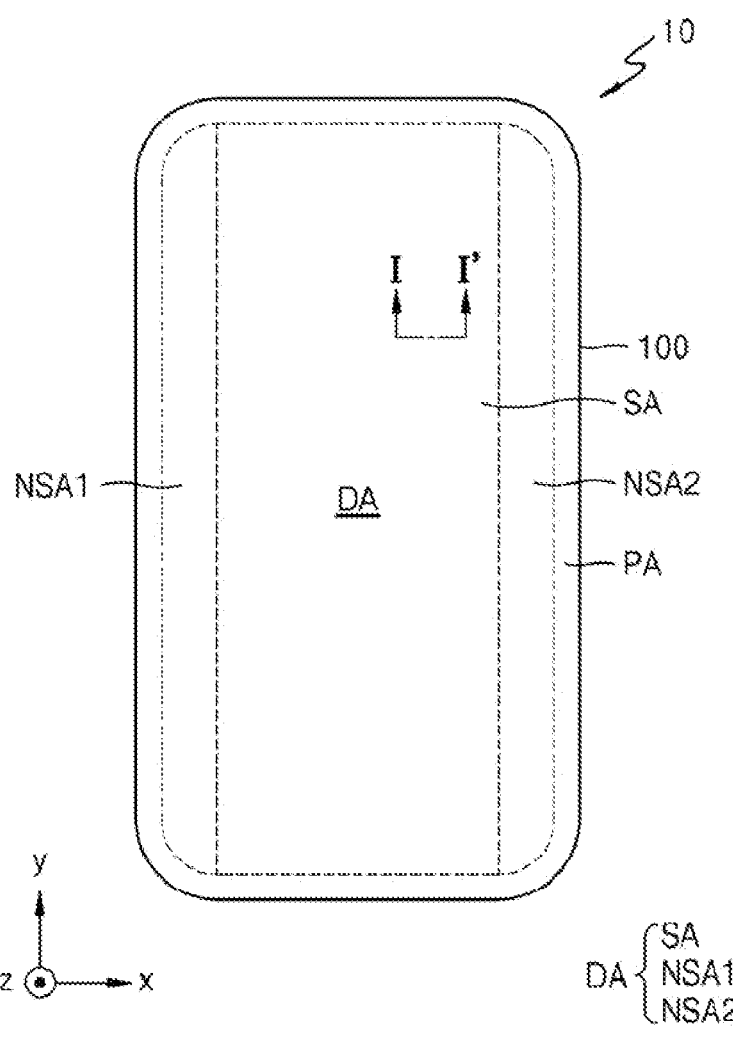

FIGS. 1 and 2 are plan views schematically illustrating a display apparatus 10 according to one or more embodiments.

Referring to FIGS. 1 and 2, the display apparatus 10 may include a display area DA and a peripheral area PA outside the display area DA along an edge or periphery of the display area DA. Regarding the display apparatus 10 including the display area DA and the peripheral area PA, it may be understood that the display area DA and the peripheral area PA are defined on a substrate 100 included in the display apparatus 10.

The substrate 100 may include various materials having flexible, bendable, and/or rollable properties. For example, the substrate 100 may include a polymer resin, such as polyethersulfone, polyacrylate, polyetherimide, polyethylene naphthalate, polyethylene terephthalate, polyphenylene sulfide, polyarylate, polyimide, polycarbonate, and/or cellulose acetate propionate.

The substrate 100 may have a multi-layered structure including two layers and a barrier layer therebetween, wherein the two layers include a polymer resin as described above, and the barrier layer includes an inorganic material, such as silicon oxide, silicon nitride, silicon oxynitride, aluminum oxide, titanium oxide, tantalum oxide, hafnium oxide, and/or zinc oxide.

The display area DA may have a plurality of pixels arranged therein, and may be an area in which an image is displayed. In a plan view, the display area DA may have a rectangular shape. In one or more embodiments, the display area DA may have a polygonal shape, such as a triangle, a pentagon, and/or a hexagon, a circular shape, an elliptical shape, and/or an amorphous shape. The display area DA may have a shape with round edge corners.

In one or more embodiments, as shown in FIG. 1, the display apparatus 10 may include the display area DA in which a length in a first direction (y direction) is greater than a length in a second direction (x direction). In another embodiment, the display apparatus 10 may include the display area DA in which the length in the second direction (x direction) is greater than the length in the first direction (y direction).

The display area DA may include a light detection area SA, a first non-detection area NSA1, and a second non-detection area NSA2, the first non-detection area NSA1 and the second non-detection area NSA2 being arranged at opposite sides of the light detection area SA, respectively. For example, in a central portion of the display area DA, the light detection area SA may extend from an upper (+y direction) boundary of the display area DA to a lower (−y direction) boundary of the display area DA. The first non-detection area NSA1 may be arranged between a left (−x direction) boundary of the light detection area SA and the peripheral area PA, and the second non-detection area NSA2 may be arranged between a right (+x direction) boundary of the light detection area SA and the peripheral area PA.

The light detection area SA may be an area in which a plurality of light detectors are arranged between pixels to detect light incident toward the display apparatus 10 and obtain image information or the like. In a plan view, the light detection area SA may have a rectangular shape in which a length in a first direction (y direction) is greater than a length in a second direction (x direction). The first non-detection area NSA1 and the second non-detection area NSA2 may be areas in which light detectors are not arranged, and only pixels are arranged.

The peripheral area PA may be arranged to be around (e.g., to surround) at least a portion of the display area DA on the outside of the display area DA. The peripheral area PA may be a kind of non-display area in which pixels are not arranged. In addition, the peripheral area PA may be a kind of non-detection area in which light detectors are not arranged.

In the peripheral area PA, lines for transferring electrical signals to the display area DA, outer circuits electrically connected to pixel circuits and light detection circuits, and pads to which a printed circuit board or a driver integrated circuit (IC) chip is attached may be located. The pads arranged in the peripheral area PA may be exposed without being covered by an insulating layer, and may be electrically connected to the printed circuit, the driver IC chip, or the like.

Figure 3:
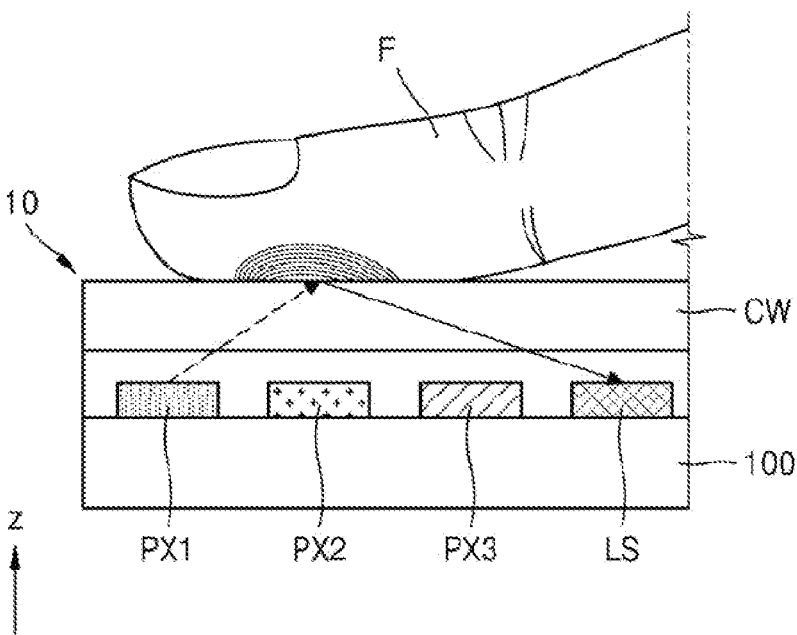
FIG. 3 is a cross-sectional view schematically illustrating a display apparatus according to one or more embodiments.

FIG. 3 is a cross-sectional view schematically illustrating the display apparatus 10 according to one or more embodiments.

Referring to FIG. 3, the display apparatus 10 according to one or more embodiments may include a substrate 100, and a first pixel PX1, a second pixel PX2, a third pixel PX3, a light detector LS, and a cover window CW disposed on the substrate 100.

Each of the first pixel PX1, the second pixel PX2, and the third pixel PX3 may include a light-emitting diode and a pixel circuit connected to the light-emitting diode, and the light detector LS may include a photo diode and a light detection circuit connected to the photo diode.

In one or more embodiments, the first pixel PX1, the second pixel PX2, and the third pixel PX3 may emit light of different colors from each other. For example, the first pixel PX1 may emit light of a first color, the second pixel PX2 may emit light of a second color, and the third pixel PX3 may emit light of a third color. In this case, the light of the first color, the light of the second color, and the light of the third color may be red light, green light, and blue light, respectively. However, one or more embodiments may not be limited thereto.

The display apparatus 10 may have a function of sensing an object, for example, a fingerprint of a finger F, in contact with the cover window CW. In one or more embodiments, light emitted from at least one of the first pixel PX1, the second pixel PX2, and the third pixel PX3 may be reflected by a fingerprint of a user and re-incident on the light detector LS. The light detector LS may detect reflected light and convert the light into an electric signal. For example, the light of the first color emitted by the first pixel PX1 is reflected by the fingerprint of the finger F in contact with the cover window CW and re-incident on the light detector LS, and the light detector LS may obtain a fingerprint pattern of the finger F.

In FIG. 3, an example in which information of an object in contact with the display apparatus 10 is obtained by using reflection of light emitted by the first pixel PX1 is illustrated. However, one or more embodiments are not limited thereto. The display apparatus 10 may detect an object not in contact with the cover window CW of the display apparatus 10.

Figure 4:
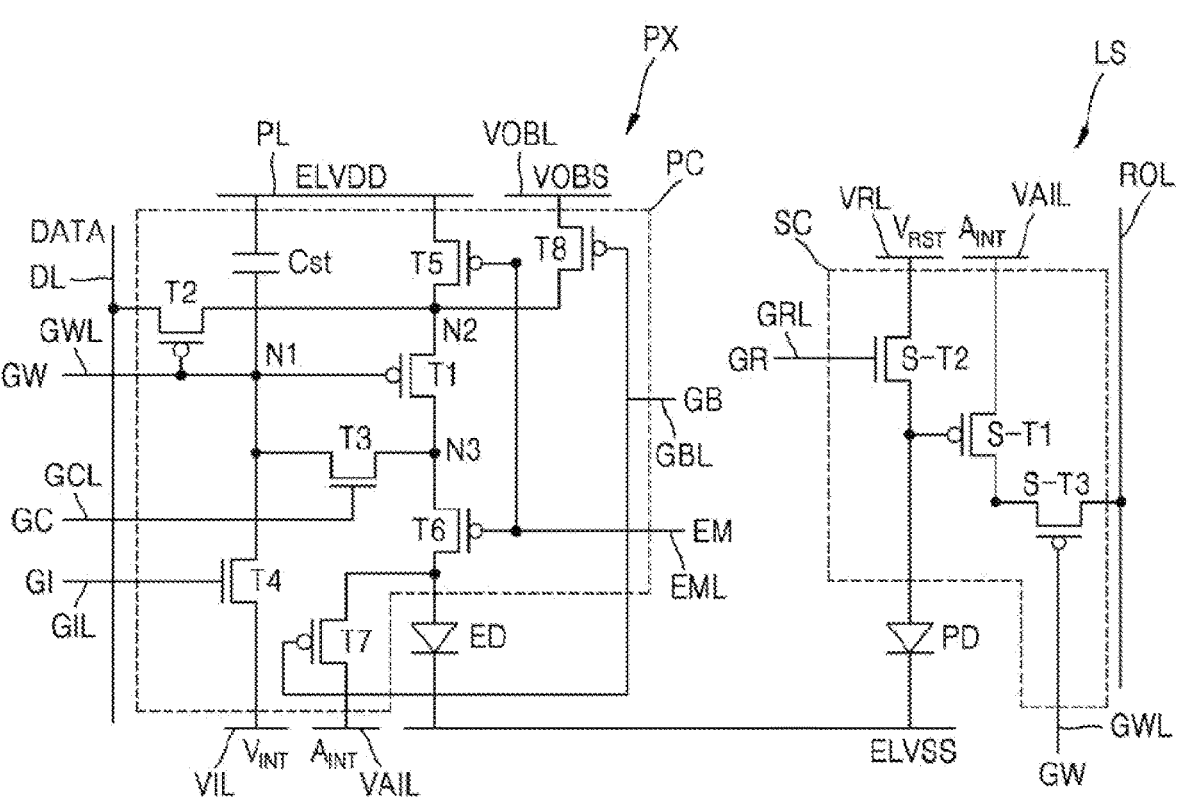
FIG. 4 is an equivalent circuit diagram schematically illustrating one pixel and one light detector included in the display apparatus according to one or more embodiments.

FIG. 4 is an equivalent circuit diagram schematically illustrating one pixel PX and one light detector LS included in a display apparatus, according to one or more embodiments.

Referring to FIG. 4, the pixel PX may include a light-emitting diode ED and a pixel circuit PC connected to the light-emitting diode ED, and the light detector LS may include a photo diode PD and a light detection circuit SC connected to the photo diode PD.

The pixel circuit PC may include first to eighth transistors T1 to T8 and a storage capacitor Cst, and the light detection circuit SC may include first to third detection transistors S-T1 to S-T3.

The first transistor T1 may be a driving transistor for outputting a driving current corresponding to a data signal DATA, and the second to eighth transistors T2 to T8 may be switching transistors for transferring signals. A first terminal and a second terminal of each of the first to eighth transistors T1 to T8 and the first to third detection transistors S-T1 to S-T3 may be a source or a drain, depending on voltages of the first terminal and the second terminal. For example, depending on the voltages of the first terminal and the second terminal, the first terminal may be a drain and the second terminal may be a source, or the first terminal may be a source and the second terminal may be a drain.

A node connected to a gate of the first transistor T1 may be defined as a first node N1, a node to which a first terminal of the first transistor T1 is connected may be defined as a second node N2, and a node to which a second terminal of the first transistor T1 is connected may be defined as a third node N3.

The pixel PX may be connected to a first gate line GWL for transferring a first gate signal GW, a second gate signal GCL for transferring a second gate signal GC, a third gate line GIL for transferring a third gate signal GI, a fourth gate line EML for transferring a fourth gate signal EM, and a fifth gate line GBL for transferring a fifth gate signal GB. Because emission of the pixel PX is controlled by the fourth gate signal EM, the fourth gate signal EM may be defined as an emission control signal, and the fourth gate line EML may be defined as an emission control line.

In addition, the pixel PX may be connected to a driving voltage line PL for transferring a driving voltage ELVDD, a common voltage line for transferring a common voltage ELVSS, a reference voltage line VOBL for transferring a reference voltage VOBS, a data line DL for transferring the data signal DATA, a first initialization voltage line VIL for transferring a first initialization voltage $V_{INT}$, and a second initialization voltage line VAIL for transferring a second initialization voltage $A_{INT}$.

The gate of the first transistor T1 (e.g., a driving transistor) may be connected to the first node N1, the first terminal of the first transistor T1 may be connected to the second node N2, and the second terminal of the first transistor T1 may be connected to the third node N3. The first terminal of the first transistor T1 may be connected to the driving voltage line PL via the fifth transistor T5, and the second terminal of the first transistor T1 may be connected to a first electrode (e.g., a pixel electrode) of the light-emitting diode ED via the sixth transistor T6. The first transistor T1 may receive the data signal DATA in response to a switching operation of the second transistor T2 and control an amount of current (e.g., a driving current) flowing in the light-emitting diode ED.

The second transistor T2 (e.g., a data write transistor) may be connected between the data line DL and the second node N2. The second transistor T2 may include a gate connected to the first gate line GWL, a first terminal connected to the data line DL, and a second terminal connected to the second node N2. The second transistor T2 may be turned on by the first gate signal GW received via the first gate line GWL, and may electrically connect the data line DL to the second node N2 and transfer the data signal DATA received via the data line DL to the second node N2.

The third transistor T3 (e.g., a compensation transistor) may be connected between the first node N1 and the third node N3. The third transistor T3 may include a gate connected to the second gate line GCL, a first terminal connected to the first node N1, and a second terminal connected to the third node N3. The third transistor T3 may be turned on by the second gate signal GC received via the second gate line GCL, to diode-connect the first transistor T1.

The fourth transistor T4 (e.g., a first initialization transistor) may be connected between the first node N1 and the first initialization voltage line VIL. The fourth transistor T4 may include a gate connected to the third gate line GIL, a first terminal connected to the first node N1, and a second terminal connected to the first initialization voltage line VIL. The fourth transistor T4 may be turned on by the third gate signal GI connected thereto via the third gate line GIL, and may transfer the first initialization voltage $V_{INT}$ received via the first initialization voltage line VIL to the first node N1.

The fifth transistor T5 (e.g., a first emission control transistor) may be connected between the driving voltage line PL and the second node N2. The fifth transistor T5 may include a gate connected to the fourth gate line EML, a first terminal connected to the driving voltage line PL, and a second terminal connected to the second node N2. The fifth transistor T5 may be turned on or off in response to the fourth gate signal EM received via the fourth gate line EML.

The sixth transistor T6 (e.g., a second emission control transistor) may be connected between the third node N3 and the light-emitting diode ED. The sixth transistor T6 may include a gate connected to the fourth gate line EML, a first terminal connected to the third node N3, and a second terminal connected to the light-emitting diode ED. The sixth transistor T6 may be turned on or off in response to the fourth gate signal EM received via the fourth gate line EML.

The seventh transistor T7 (e.g., a second initialization transistor) may be connected between the light-emitting diode ED and the second initialization voltage line VAIL. The seventh transistor T7 may include a gate connected to the fifth gate line GBL, a first terminal connected to the light-emitting diode ED, and a second terminal connected to the second initialization voltage line VAIL. The seventh transistor T7 may be turned on by the fifth gate signal GB received via the fifth gate line GBL, and may transfer the second initialization voltage $A_{INT}$ received via the second initialization voltage line VAIL to the pixel electrode of the light-emitting diode ED.

The eighth transistor T8 (e.g., a third initialization transistor) may be connected between the reference voltage line VOBL and the second node N2. The eighth transistor T8 may include a gate connected to the fifth gate line GBL, a first terminal connected to the reference voltage line VOBL, and a second terminal connected to the second node N2. The eighth transistor T8 may be turned on by the fifth gate signal GB received via the fifth gate line GBL and may transfer the reference voltage VOBS received via the reference voltage line VOBL to the second node N2.

The storage capacitor Cst may be connected between the driving voltage line PL and the first node N1. A first electrode of the storage capacitor Cst may be connected to the first node N1, and a second electrode may be connected to the driving voltage line PL. The storage capacitor Cst may store a charge corresponding to a voltage difference between the driving voltage ELVDD and a voltage of the gate of the first transistor T1.

The light-emitting diode ED may be connected to the first transistor T1 via the sixth transistor T6. The light-emitting diode ED may include a pixel electrode (e.g., a first electrode) connected to the second terminal of the sixth transistor T6, and an opposite electrode (e.g., a second electrode) facing the pixel electrode, and the opposite electrode may receive a common voltage ELVSS. The opposite electrode may be a common electrode integrally provided across a plurality of pixels PX and a plurality of light detectors LS.

The light detector LS may be connected to the first gate line GWL for transferring the first gate signal GW, and a sixth gate line GRL for transferring a sixth gate signal GR.

In addition, the light detector LS may be connected to a reset voltage line VRL for transferring a reset voltage $V_{RST}$, the second initialization voltage line VAIL for transferring the second initialization voltage $A_{INT}$, and a read-out line ROL.

A first detection transistor S-T1 may be connected between the second initialization voltage line VAIL and a third detection transistor S-T3. The first detection transistor S-T1 may include a gate connected to a detection electrode of the photo diode PD, a first terminal connected to the second initialization voltage line VAIL, and a second terminal connected to the read-out line ROL via the third detection transistor S-T3. The first detection transistor S-T1 may be turned on by a light detection signal of the photo diode PD and may transfer the second initialization voltage $A_{INT}$ received via the second initialization voltage line VAIL to the read-out line ROL via the third detection transistor S-T3.

The second detection transistor S-T2 may be connected between the reset voltage line VRL and the photo diode PD. The second detection transistor S-T2 may include a gate connected to the sixth gate line GRL, a first terminal connected to the reset voltage line VRL, and a second terminal connected to the gate of the first detection transistor S-T1. The second detection transistor S-T2 may be turned on by the sixth gate signal GR received via the sixth gate line GRL, and may transfer the reset voltage $V_{RST}$ received via the reset voltage line VRL to the gate of the first detection transistor S-T1, to initialize the gate of the first detection transistor S-T1.

The third detection transistor S-T3 may be connected between the first detection transistor S-T1 and the read-out line ROL. The third detection transistor S-T3 may include a gate connected to the first gate line GWL, a first terminal connected to the first detection transistor S-T1, and a second terminal connected to the read-out line ROL. The third detection transistor S-T3 may be turned on by the first gate signal GW received via the first gate line GWL and may transfer, to the read-out line ROL, the second initialization voltage AINT received via the first detection transistor S-T1 from the second initialization voltage line VAIL.

The photo diode PD may include a detection electrode (e.g., a first electrode) connected to the gate of the first detection transistor S-T1, and an opposite electrode (e.g., a second electrode) facing the detection electrode, and the opposite electrode may receive the common voltage ELVSS. The opposite electrode may be a common electrode integrally provided across the plurality of pixels PX and the plurality of light detectors LS.

In FIG. 4, a case in which the pixel circuit PC includes eight transistors and one capacitor, and the light detection circuit SC includes three transistors is described. However, one or more embodiments are not limited thereto.

Some of the first to eighth transistors T1 to T8 and the first to third detection transistors S-T1 to S-T3 may be n-type oxide thin-film transistors, and the other transistors may be p-type silicon thin-film transistors. In one or more embodiments, the third transistor T3, the fourth transistor T4, and the second detection transistors S-T2 may be n-type oxide thin-film transistors, and the other transistors may be p-type silicon thin-film transistors.

An oxide thin-film transistor may be a low temperature polycrystalline oxide (LTPO), in which an active pattern (e.g., a semiconductor layer) includes an oxide. However, this is only an example, and n-type transistors are not limited thereto. For example, an active pattern (e.g., a semiconductor layer) included in the n-type transistor may include an inorganic material semiconductor (e.g., amorphous silicon, polysilicon) or an organic material semiconductor. The silicon thin-film transistor may be an LTPS thin-film transistor, in which an active pattern (e.g., a semiconductor layer) includes amorphous silicon, polysilicon, etc.

Figure 5:
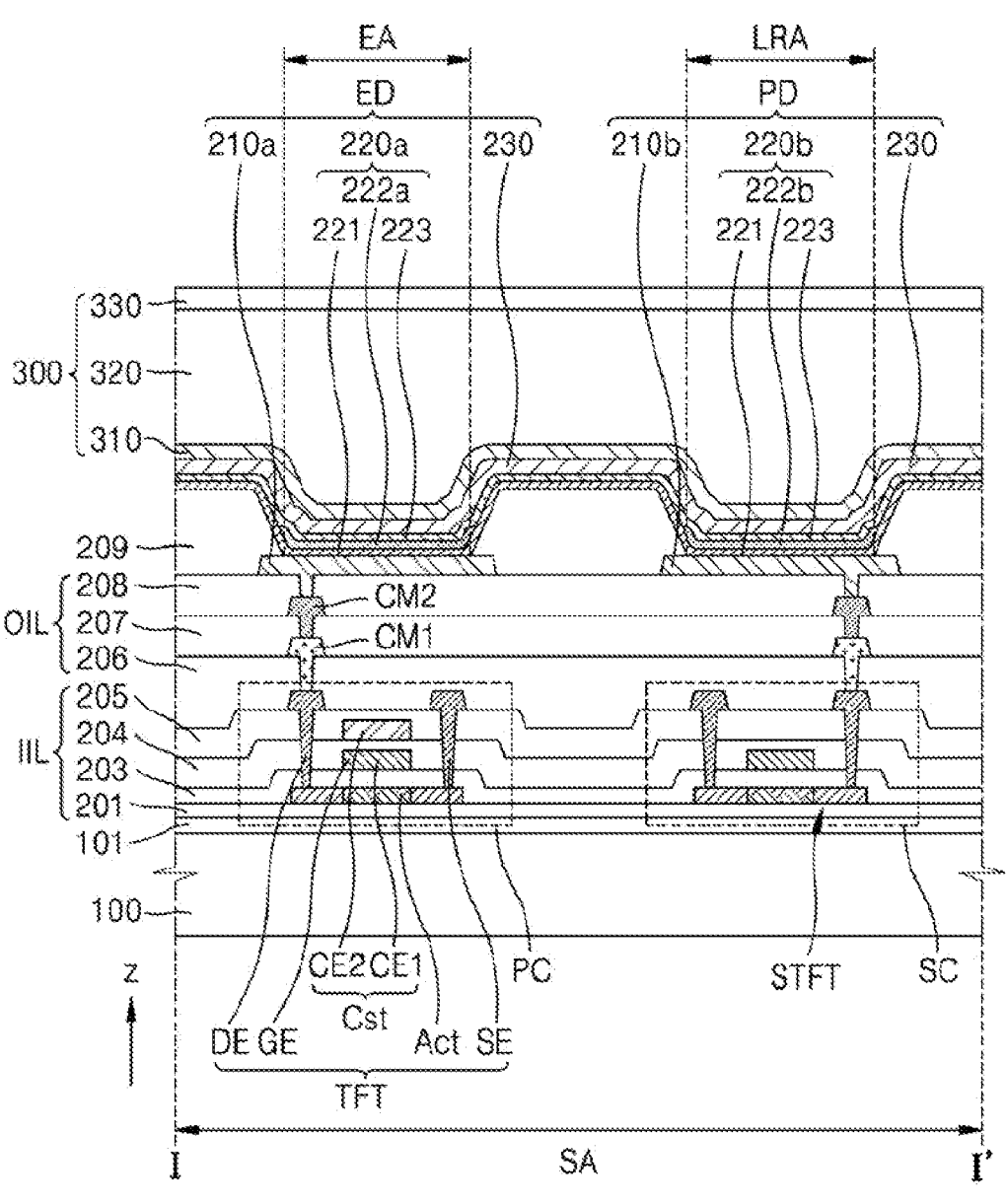
FIG. 5 is a cross-sectional view schematically illustrating a display apparatus according to one or more embodiments.

FIG. 5 is a cross-sectional view schematically illustrating the display apparatus 10 according to one or more embodiments. FIG. 5 schematically illustrates a cross-sectional view of the display apparatus 10 in FIG. 2, taken along the line I-I' in FIG. 2.

Referring to FIG. 5, the display apparatus 10 according to one or more embodiments may include the substrate 100.

The substrate 100 may include the light-detection area SA, and the pixel PX and the light detector LS may be disposed on the light-detection area SA. As described with reference to FIG. 4, one pixel PX may include the light-emitting diode ED and the pixel circuit PC electrically connected to the light-emitting diode ED, and the light detector LS may include the photo diode PD and the light detection circuit SC electrically connected to the photo diode PD. The light-emitting diode ED may be an organic light-emitting diode, which is an emission element, and the photo diode PD may be an organic photodiode, which is a light-receiving element.

A barrier layer 101 may be disposed on the substrate 100. The barrier layer 101 may include an inorganic insulating material, such as silicon nitride, silicon oxide, and/or silicon oxynitride.

A buffer layer 201 may be disposed on the barrier layer 101. The barrier layer 101 and the buffer layer 201 may reduce or block permeation of foreign substances, moisture, or ambient air from a lower portion of the substrate 100, and provide a flat surface on the substrate 100. The buffer layer 201 may include an inorganic material, such as silicon nitride, silicon oxide, or silicon oxynitride, an organic material, or an organic/inorganic composite.

The pixel circuit PC and the light detection circuit SC may be disposed on the buffer layer 201.

The pixel circuit PC may include a thin-film transistor TFT and a storage capacitor Cst. The thin-film transistor TFT may include a semiconductor layer Act, the gate electrode GE, a source electrode SE, and a drain electrode DE, and the storage capacitor Cst may include a first electrode CE1 and a second electrode CE2.

The semiconductor layer Act may be disposed on the buffer layer 201. The semiconductor layer Act may include polysilicon. Alternatively, the semiconductor layer Act may include amorphous silicon, an oxide semiconductor, or an organic semiconductor. The semiconductor layer Act may include a channel region, and a drain region and a source area respectively arranged at opposite sides of the channel region.

The gate electrode GE may be disposed on the semiconductor layer Act. The gate electrode GE may overlap the channel region of the semiconductor layer Act in a thickness direction of the substrate 100 (e.g., the z direction). The gate electrode GE may include a low-resistance metal material. The gate electrode GE may include a conductive material, including molybdenum (Mo), aluminum (Al), copper (Cu), and/or titanium (Ti), and may include a layer or layers including the materials described above.

A first gate insulating layer 203 may be arranged between the semiconductor layer Act and the gate electrode GE. The first gate insulating layer 203 may include an inorganic insulating material, such as silicon oxide, silicon nitride, silicon oxynitride, aluminum oxide, titanium oxide, tantalum oxide, hafnium oxide, and/or zinc oxide. The first gate insulating layer 203 may be a layer or layers including the inorganic insulating material described above.

A second gate insulating layer 204 may be disposed on the gate electrode GE to cover the gate electrode GE and the first gate insulating layer 203. The second gate insulating layer 204 may include an inorganic insulating material, such as silicon oxide, silicon nitride, silicon oxynitride, aluminum oxide, titanium oxide, tantalum oxide, hafnium oxide, and/or zinc oxide. The second gate insulating layer 204 may be a layer or layers including the inorganic insulating material described above.

The second electrode CE2 of the storage capacitor Cst may be disposed on the second gate insulating layer 204. At least a portion of the second electrode CE2 may overlap the gate electrode GE in the thickness direction of the substrate 100 (e.g., the z direction). In this case, the gate electrode GE overlapping the second electrode CE2 of the storage capacitor Cst may function as the first electrode CE1 of the storage capacitor Cst. For example, the gate electrode GE may be integrally formed as a single body with the first electrode CE1.

The second electrode CE2 may include a conductive material, including Mo, Al, Cu, and/or Ti, and may include a layer or layers including the materials described above.

An interlayer insulating layer 205 may be disposed on the second electrode CE2 and the second gate insulating layer 204. The interlayer insulating layer 205 may be formed to cover the second electrode CE2, and may include silicon oxide, silicon nitride, and/or silicon oxynitride. The interlayer insulating layer 205 may be a layer or layers including the inorganic insulating materials described above. An inorganic insulating layer IIL may include the buffer layer 201, the first gate insulating layer 203, the second gate insulating layer 204, and the interlayer insulating layer 205.

The source electrode SE and the drain electrode DE may be disposed on the interlayer insulating layer 205. Each of the source electrode SE and the drain electrode DE may include a conductive material, including Mo, Al, Cu, and/or Ti, and may include a layer or layers including the material described above. For example, each of the source electrode SE and the drain electrode DE may include a multi-layered structure of Ti/Al/Ti. In one or more embodiments, the source electrode SE or the drain electrode DE may be omitted.

The light detection circuit SC may include a detection thin-film transistor STFT. The detection thin-film transistor STFT included in the light detection circuit SC may have a structure similar to a structure of the thin-film transistor TFT included in the pixel circuit PC.

An organic insulating layer OIL may be arranged to cover the pixel circuit PC and the light detection circuit SC. The organic insulating layer OIL may include a first planarization layer 206, a second planarization layer 207, and a third planarization layer 208, which are sequentially stacked in a thickness direction (e.g., the z direction).

The first planarization layer 206, the second planarization layer 207, and the third planarization layer 208 may provide a flat base surface to a pixel electrode 210a of the light-emitting diode ED and a detection electrode 210b of the photo diode PD, which are disposed on the first to third planarization layers 206 to 208.

Each of the first planarization layer 206, the second planarization layer 207, and the third planarization layer 208 may include general-purpose polymers, such as benzocyclobutene (BCB), polyimide, hexamethyldisiloxane (HMDSO), polymethylmethacrylate (PMMA), and/or polystyrene (PS), polymer derivatives having a phenol-based group, acryl-based polymers, imide-based polymers, aryl ether-based polymers, amide-based polymers, fluorine-based polymers, p-xylene-based polymers, and/or vinyl alcohol-based polymers. Each of the first planarization layer 206, the second planarization layer 207, and the third planarization layer 208 may be a layer or layers including the organic insulating materials described above.

A first connection electrode CM1 may be arranged between the first planarization layer 206 and the second planarization layer 207, and a second connection electrode CM2 may be arranged between the second planarization layer 207 and the third planarization layer 208. The first connection electrode CM1 may be connected to the drain electrode DE of the thin-film transistor TFT via a contact hole defined in the first planarization layer 206. The second connection electrode CM2 may be connected to the first connection electrode CM1 via a contact hole defined in the second planarization layer 207.

Each of the first connection electrode CM1 and the second connection electrode CM2 may include a conductive material, including Mo, Al, Cu, and/or Ti, and may include a layer or layers including the material described above.

The light-emitting diode ED and the photo diode PD may be disposed on the organic insulating layer OIL. The light-emitting diode ED may include the pixel electrode 210a, an opposite electrode 230, and a first intermediate layer 220a arranged between the pixel electrode 210a and the opposite electrode 230. The photo diode PD may include the detection electrode 210b, an opposite electrode 230, and a second intermediate layer 220b arranged between the detection electrode 210b and the opposite electrode 230. The opposite electrode 230 of the light-emitting diode ED and the opposite electrode 230 of the photo diode PD may be integrally provided as a single body.

The pixel electrode 210a and the detection electrode 210b may be disposed on the third planarization layer 208 to be spaced from each other. The pixel electrode 210a may be electrically connected to the thin-film transistor TFT of the pixel circuit PC by the first connection electrode CM1 and the second connection electrode CM2.

The pixel electrode 210a may include a conductive oxide, such as indium tin oxide (ITO), indium zinc oxide (IZO), zinc oxide (ZnO), indium oxide ($In_2O_3$), indium gallium oxide (IGO), and/or aluminum zinc oxide (AZO). The pixel electrode 210a may include a reflective film including silver (Ag), magnesium (Mg), aluminum (Al), platinum (Pt), palladium (Pd), gold (Au), nickel (Ni), neodymium (Nd), iridium (Ir), chrome (Cr), and/or a compound thereof. In one or more embodiments, the pixel electrode 210a may have a structure having films including ITO, IZO, ZnO, and/or $In_2O_3$, over/under the reflective film described above. The pixel electrode 210a may have a stack structure of ITO/Ag/ITO.

The detection electrode 210b may be electrically connected to the detection thin-film transistor STFT of the light detection circuit SC by the connection electrodes. The detection electrode 210b may have a structure identical or similar to a structure of the pixel electrode 210a.

A pixel-defining layer 209 may be disposed on the third planarization layer 208 to cover an edge of each of the pixel electrode 210a and the detection electrode 210b. The pixel-defining layer 209 may define an opening exposing a central portion of the pixel electrode 210a and an opening exposing a central portion of the detection electrode 210b. A size and shape of an emission area EA of the light-emitting diode ED may be defined by the opening exposing the central portion of the pixel electrode 210a. A size and shape of a light-receiving area LRA of the photo diode PD may be defined by the opening exposing the central portion of the detection electrode 210b.

The pixel-defining layer 209 may increase a distance between an edge of the pixel electrode 210a and the opposite electrode 230 and a distance between an edge of the detection electrode 210b and the opposite electrode 230, thereby preventing an arc or the like from occurring at the edge of the pixel electrode 210a and the edge of the detection electrode 210b. The pixel-defining layer 209 may include an organic insulating material, such as polyimide, polyamide, acrylic resin, benzocyclobutene, hexamethyldisiloxane (HMDSO), and/or phenolic resin, and may be formed by a method such as spin coating.

The first intermediate layer 220a may be disposed on the pixel electrode 210a. The first intermediate layer 220a may include an emission layer 222a, a first functional layer 221, and a second functional layer 223, wherein the emission layer 222a is arranged to correspond to the pixel electrode 210a, and the first functional layer 221 and the second functional layer 223 are disposed under and/or over the emission layer 222a.

The second intermediate layer 220b may be disposed on the detection electrode 210b. The second intermediate layer 220b may include an active layer 222b, the first functional layer 221, and the second functional layer 223, wherein the active layer 222b is arranged to correspond to the detection electrode 210b, and the first functional layer 221 and the second functional layer 223 are disposed under and/or over the active layer 222b. The first functional layer 221 and the second functional layer 223 may be common layers integrally provided as a single body across the light-emitting diode ED and the photo diode PD.

The emission layer 222a may include an organic material including a fluorescent or phosphorescent material emitting red, green, blue, or white light. The emission layer 222a may be an organic emission layer including a low-molecular weight organic material and/or a polymer organic material. For example, the emission layer 222a, which is an organic emission layer, may include copper phthalocyanine, tris-8-hydroxyquinoline aluminum, a poly-phenylenevinylene (PPV)-based material, and/or a polyfluorene-based materials.

In one or more embodiments, the emission layer 222a may include a host material and a dopant material. The dopant material is a material emitting light of a specific color, and may include a light-emitting material. The light-emitting material may include at least one of a phosphorescent dopant, a fluorescent dopant, and/or quantum dots.

The active layer 222b may include a p-type organic semiconductor and/or an n-type organic semiconductor. In this case, the p-type organic semiconductor may act as an electron donor, and the n-type organic semiconductor may act as an electron acceptor.

In one or more embodiments, the active layer 222b may be a mixed layer, in which the p-type organic semiconductor and the n-type organic semiconductor are mixed together. In this case, the active layer 222b may be formed by co-deposition of the p-type organic semiconductor and the n-type organic semiconductor. When the active layer 222b is a mixed layer, excitons may be generated within a diffusion length from a donor-acceptor interface.

In one or more embodiments, the p-type organic semi-conductor may be a compound that acts as an electron donor supplying electrons. For example, the p-type organic semi-conductor may include boron subphthalocyanine (SubPc), copper(II) phthalocyanine (CuPc), tetraphenyldibenzoperi-plantene (DBP), and/or any combinations thereof, but is not limited thereto.

In one or more embodiments, the n-type organic semi-conductor may be a compound that acts as an electron acceptor receiving electrons. For example, the n-type organic semiconductor may include C60 fullerene, C70 fullerene, and/or any combinations thereof, but is not limited thereto.

In one or more embodiments, the first functional layer 221 may include at least one layer from among a hole injection layer, a hole injection layer, a hole transport layer, and/or an electron blocking layer. The first functional layer 221 may have a single-layered structure or a multi-layered structure. When the first functional layer 221 has a multi-layered structure, the first functional layer 221 may include, as being each sequentially stacked in a thickness direction (e.g., the z direction), a hole injection layer and a hole transport layer, a hole injection layer and an electron blocking layer, a hole transport layer and an electron blocking layer, and/or a hole injection layer, a hole transport layer, and an electron blocking layer. However, one or more embodiments are not limited thereto.

In one or more embodiments, the second functional layer 223 may include at least one layer from among an electron injection layer, an electron transport layer, and a hole blocking layer. The second functional layer 223 may have a single-layered structure or a multi-layered structure. When the second functional layer 223 has a multi-layered struc-ture, the second functional layer 223 may include, as being each sequentially stacked in a thickness direction (e.g., the z direction), an electron transport layer and an electron injection layer, a hole blocking layer and an electron injec-tion layer, a hole blocking layer and an electron transport layer, or a hole blocking layer, an electron transport layer, and an electron injection layer. However, one or more embodiments are not limited thereto.

The opposite electrode 230 may be disposed on the first intermediate layer 220a and the second intermediate layer 220b. The opposite electrode 230 may include a conductive material having a relatively low work function. For example, the opposite electrode 230 may include a (semi-transparent layer (or a transparent layer) including Ag, Mg, Al, Ni, Cr, lithium (Li), calcium (Ca), and/or an alloy thereof. Alterna-tively, the opposite electrode 230 may further include a layer including ITO, IZO, ZnO, and/or $In_2O_3$, on the (semi-transparent layer (or the transparent layer) including the materials described above. In one or more embodiments, the opposite electrode 230 may include Ag and Mg.

An encapsulation layer 300 may be disposed on the opposite electrode 230 to cover the light-emitting diode ED and the photo diode PD. In one or more embodiments, the encapsulation layer 300 may include at least one inorganic encapsulation layer and at least one organic encapsulation layer. For example, the encapsulation layer 300 may include first and second inorganic encapsulation layers 310 and 330 and an organic encapsulation layer 320 arranged therebe-tween.

Each of the first and second inorganic encapsulation layers 310 and 330 may include one or more inorganic insulating materials. The inorganic insulating immaterial may include silicon oxide, silicon nitride, and/or silicon oxynitride. The first and second inorganic encapsulation layers 310 and 330 may be formed through chemical vapor deposition.

The organic encapsulation layer 320 may further include polyethylene terephthalate, polyethylene naphthalate, poly-carbonate, polyimide, polyethylene sulfonate, polyoxymeth-ylene, polyarylate, HMDSO, acryl-based resin, and/or a combination thereof. The organic encapsulation layer 320 may provide a flat upper surface. Accordingly, even when an input sensing layer or the like is formed on the encapsulation layer 300 by a continuous process, a defect rate may be reduced.

The encapsulation layer 300 may cover the entire display area DA and may be arranged to extend to the peripheral area PA and cover at least a portion of the peripheral area PA.

Figure 6:
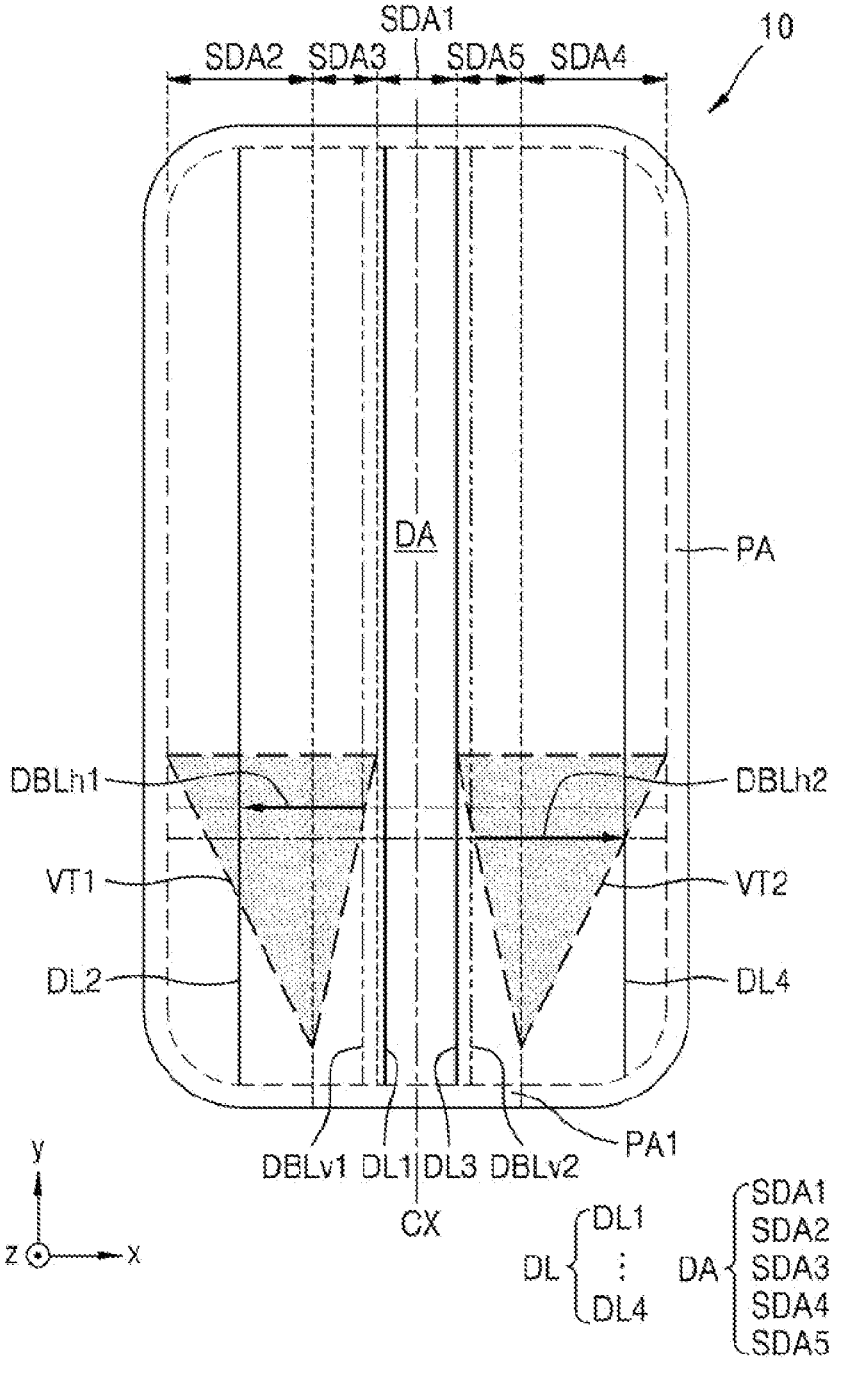
FIG. 6 is a diagram schematically illustrating a data line and a data connection line of a display apparatus according to one or more embodiments.

FIG. 6 is a diagram schematically illustrating data lines and data connection lines of the display apparatus 10 accord-ing to one or more embodiments. In FIG. 6, only some lines are shown, for convenience for description. However, one or more embodiments are not limited thereto.

Referring to FIG. 6, the display apparatus 10 may include a display area DA and a peripheral area PA. The display area DA may include first to fifth sub-display areas SDA1 to SDA5. The first sub-display area SDA1 may divide the display area DA into two equal areas and overlap an imagi-nary center line CX extending in a first direction (e.g., the y direction). The second sub-display area SDA2 may be arranged to be in contact with a left (−x direction) boundary of the display area DA, and the third sub-display area SDA3 may be arranged between the first sub-display area SDA1 and the second sub-display area SDA2. Similarly, the fourth sub-display area SDA4 may be arranged to be in contact with a right (+x direction) boundary of the display area DA, and the fifth sub-display area SDA5 may be arranged between the first sub-display area SDA1 and the fourth sub-display area SDA4.

The peripheral area PA may include a first peripheral area PA1, in which input lines connected to a data driver circuit are arranged. The first peripheral area PA1 may be located to be in contact with a lower (−y direction) boundary of each of the first sub-display area SDA1, the third sub-display area SDA3, and the fifth sub-display area SDA5.

On the entire surface of the display area DA, data lines DL each extending in the first direction (y direction) may be arranged to be approximately parallel to each other and spaced from each other in a second direction (x direction). FIG. 6 shows an example of a case in which a first data line DL1 is located in the first sub-display area SDA1, a second data line DL2 is located in the second sub-display area SDA2, a third data line DL3 is located in the fifth sub-display area SDA5, and a fourth data line DL4 is located in the fourth sub-display area SDA4.

A first vertical data connection line DBLv1 extending in the first direction (e.g., the y direction) is arranged in the third sub-display area SDA3, and a second vertical data connection line DBLv2 extending in the first direction (e.g., the y direction) may be arranged in the fifth sub-display area SDA5. The first vertical data connection line DBLv1 and the second vertical data connection line DBLv2 may be arranged to be spaced from each other in a second direction (e.g., the x direction).

A first horizontal data connection line DBLh1 may connect the first vertical data connection line DBLv1 to the second data line DL2. A second horizontal data connection line DBLh2 may connect the second vertical data connection line DBLv2 to the fourth data line DL4.

Data lines and vertical data connection lines arranged in the first sub-display area SDA1, the third sub-display area SDA3, and the fifth sub-display area SDA5 may be directly connected to input lines arranged in the first peripheral area PA1. For example, the first data line DL1, the third data line DL3, the first vertical data connection line DBLv1, and the second vertical data connection line DBLv2 shown in FIG. 6 may be directly connected to the input lines arranged in the first peripheral area PA1.

Data lines arranged in the second sub-display area SDA2 and the fourth sub-display area SDA4 may be electrically connected to input lines via vertical data connection lines and horizontal data connection lines respectively corresponding thereto. For example, the second data line DL2 shown in FIG. 6 may be connected to an input line via the first vertical data connection line DBLv1 and the first horizontal data connection line DBLh1. The fourth data line DL4 may be connected to an input line via the second vertical data connection line DBLv2 and the second horizontal data connection line DBLh2.

The first vertical data connection line DBLv1 may be located to be closer to the imaginary center line CX, which divides the display area DA into two equal areas and extends in the first direction (e.g., the y direction), than the second data line DL2. The second vertical data connection line DBLv2 may be located to be closer to the imaginary center line CX than the fourth data line DL4.

Contact portions in which a vertical data connection line and a horizontal data connection are connected to each other and contact portions in which a horizontal data connection line and a data line are connected to each other may be arranged along a boundary having an approximately triangular shape in a plan view. For example, a contact portion in which the first vertical data connection line DBLv1 and the first horizontal data connection line DBLh1 are connected to each other may be located on one side of a first imaginary triangle VT1, and a contact portion in which the second data line DL2 and the first horizontal data connection line DBLh1 are connected to each other may be located on another side of the first imaginary triangle VT1. A contact portion in which the second vertical data connection line DBLv2 and the second horizontal data connection line DBLh2 are connected to each other may be located on one side of a second virtual triangle VT2, and a contact portion in which the fourth data line DL4 and the second horizontal data connection line DBLh2 are connected to each other may be located on another side of the second imaginary triangle VT2.

The first imaginary triangle VT1 may overlap the second sub-display area SDA2 and the third sub-display area SDA3, and the second imaginary triangle VT2 may overlap the fourth sub-display area SDA4 and the fifth sub-display area SDA5. With respect to the imaginary center line CX that divides the display area DA into two equal areas and extends in the first direction (e.g., the y direction), the first imaginary triangle VT1 and the second imaginary triangle VT2 may be symmetrical to each other.

Figure 7:
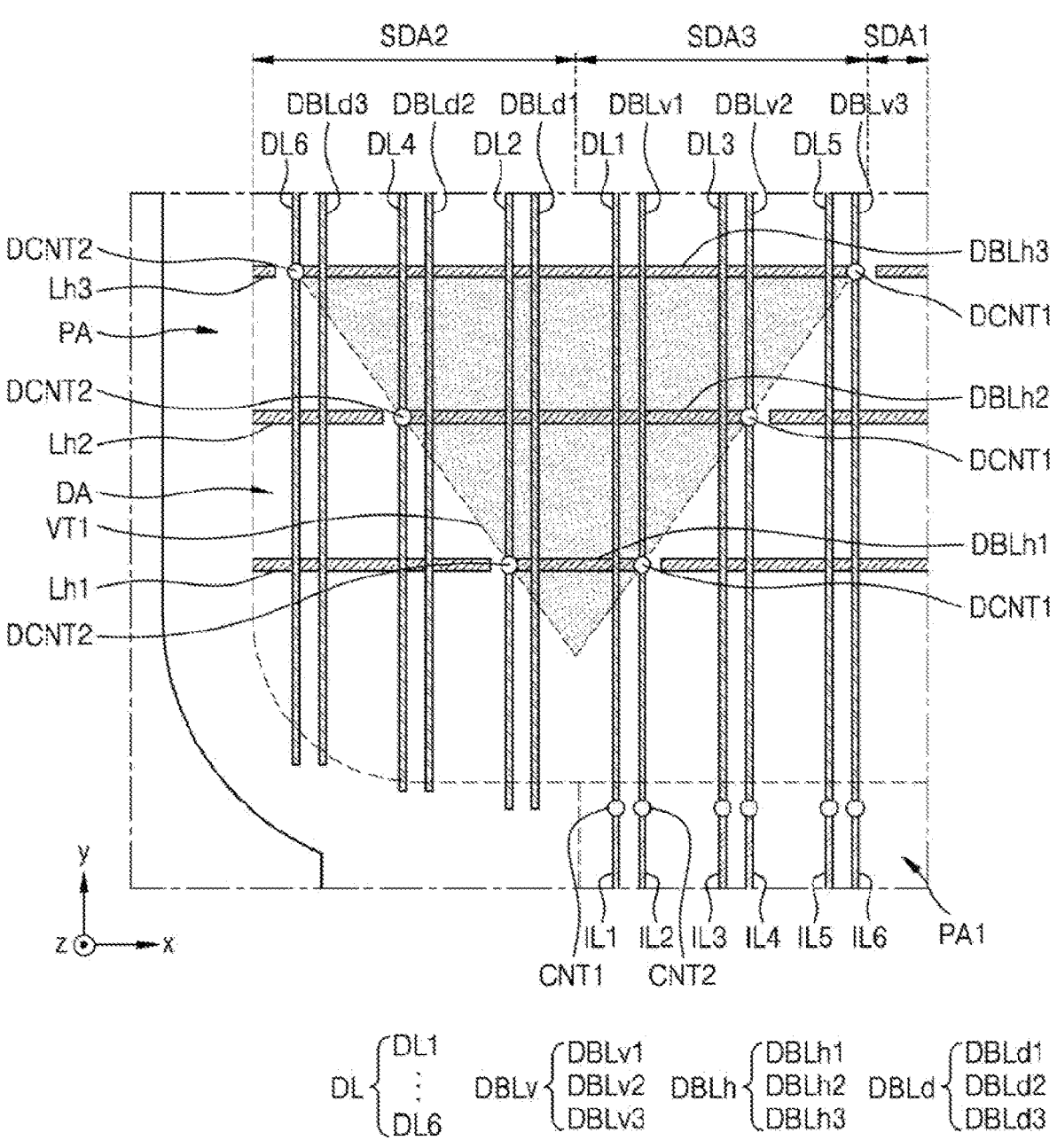
FIG. 7 is a diagram schematically illustrating a portion of the display apparatus shown in FIG. 6.

FIG. 7 is a diagram schematically illustrating a portion of the display apparatus 10 shown in FIG. 6. FIG. 7 shows an example configuration of the data lines and the data connection lines of FIG. 6.

Referring to FIG. 7, the display area DA may include the first sub-display area SDA1, the second sub-display area SDA2, and the third sub-display area SDA3 arranged between the first sub-display area SDA1 and the second sub-display area SDA2.

The peripheral area PA may be arranged outside the display area DA to be around (e.g., to surround) at least a portion of the display area DA. The peripheral area PA may include the first peripheral area PA1 adjacent to the first sub-display area SDA1 and the third sub-display area SDA3.

First to sixth input lines IL1 to IL6 may be arranged in the first peripheral area PA1. The first to sixth input lines IL1 to IL6 may be sequentially arranged to be spaced from each other in the second direction (e.g., x direction).

The data lines DL each extending in the first direction (e.g., the y direction) may be arranged in the display area DA. The data lines DL may include the first data line DL1, the third data line DL3, and the fifth data line DL5 in the third sub-display area SDA3, and may include the second data line DL2, the fourth data line DL4, and the sixth data line DL6 in the second sub-display area SDA2.

Vertical data connection lines DBLv each extending in the first direction (e.g., the y direction) may be arranged in the third sub-display area SDA3. The vertical data connection lines DBLv may include the first vertical data connection line DBLv1, the second vertical data connection line DBLv2, and a third vertical data connection line DBLv3.

Vertical dummy connection lines DBLd each extending in the first direction (e.g., the y direction) may be arranged in the second display area SDA2. The vertical dummy connection lines DBLd may include a first vertical dummy connection line DBLd1, a second vertical dummy connection line DBLd2, and a third vertical dummy connection line DBLd3.

In one or more embodiments, a first input line IL1, a third input line IL3, and a fifth input line IL5, which are located at odd numbers, may respectively be connected to the first data line DL1, the third data line DL3, and the fifth data line DL5 arranged in the third sub-display area SDA3. Each of the first input line IL1, the third input line IL3, and the fifth input line IL5 may be electrically connected via a first contact hole CNT1 to a corresponding one of the first data line DL1, the third data line DL3, and the fifth data line DL5. In one or more embodiments, each of the first input line IL1, the third input line IL3, and the fifth input line IL5 may be integrally formed as a single body with a corresponding one of the first data line DL1, the third data line DL3, and the fifth data line DL5.

A second input line IL2, a fourth input line IL4, and a sixth input line IL6, which are located at even numbers, may respectively be connected to the first vertical data connection line DBLv1, the second vertical data connection line DBLv2, and the third vertical data connection line DBLv3 arranged in the third sub-display area SDA3. Each of the second input line IL2, the fourth input line IL4, and the sixth input line IL6 may be electrically connected via a second contact hole CNT2 to a corresponding one of the first vertical data connection line DBLv1, the second vertical data connection line DBLv2, and the third vertical data connection line DBLv3. In one or more embodiments, each of the second input line IL2, the fourth input line IL4, and the sixth input line IL6 may be integrally formed as a single body with a corresponding one of the first vertical data connection line DBLv1, the second vertical data connection line DBLv2, and the third vertical data connection line DBLv3 via the second contact hole CNT2.

One end (in an +x direction) of each of the first horizontal data connection line DBLh1, the second horizontal data connection line DBLh2, and a third horizontal data connection line DBLh3 may respectively be electrically connected to the first vertical data connection line DBLv1, the second vertical data connection line DBLv2, and the third vertical data connection line DBLv3 via a third contact hole DCNT1, and the other end (in a −x direction) of each of the first horizontal data connection line DBLh1, the second horizontal data connection line DBLh2, and the third horizontal data connection line DBLh3 may respectively be electrically connected via a fourth contact hole DCNT2 to the second data line DL2, the fourth data line DL4, and the sixth data line DL6 arranged in the second sub-display area SDA2.

In one or more embodiments, the vertical dummy connection lines DBLd may not be electrically connected to the data lines DL or the vertical data connection lines DBLh. Accordingly, the vertical dummy connection lines DBLd may be omitted. However, in order for pixels arranged in the second sub-display area SDA2 and pixels arranged in the third sub-display area SDA3 to have identical or similar structures as much as possible, the vertical dummy connection lines DBLd may be arranged in the third sub-display area SDA3. Similarly, the vertical dummy connection lines DBLd may also be arranged in the first sub-display area SDA1, in which the vertical data connection lines DBLv are not arranged. Through this, a display apparatus on which a high-quality image is displayed may be implemented.

As shown in FIG. 7, a display apparatus according to one or more embodiments may include a first horizontal dummy line Lh1, which is spaced from the first horizontal data connection line DBLh1 in the second direction (e.g., the x direction), electrically insulated from the first horizontal data connection line DBLh1, the first vertical data connection line DBLv1, and the second data line DL2, and has the same extension axis as the first horizontal data connection line DBLh1. The display apparatus may include a second horizontal dummy line Lh2, which is spaced from the second horizontal data connection line DBLh2 in the second direction (e.g., the x direction), electrically insulated from the second horizontal data connection line DBLh2, the second vertical data connection line DBLv2, and the fourth data line DL4, and has the same extension axis as the second horizontal data connection line DBLh2. The display apparatus may include a third horizontal dummy line Lh3, which is spaced from the third horizontal data connection line DBLh3 in the second direction (e.g., the x direction), electrically insulated from the third horizontal data connection line DBLh3, the third vertical data connection line DBLv3, and the sixth data line DL6, and has the same extension axis as the third horizontal data connection line DBLh3.

In one or more embodiments, a line connecting the third contact holes DCNT1 and a line connecting the fourth contact holes DCNT2 may form a boundary of the first imaginary triangle VT1, and the horizontal data connection lines DBLh may be arranged to overlap the first imaginary triangle VT1. The first horizontal dummy line Lh1, the second horizontal dummy line Lh2, and the third horizontal dummy line Lh3 may be arranged outside the first imaginary triangle VT1 to be spaced from the first imaginary triangle VT1.

Through this, structural difference between pixels through which the horizontal data connection lines DBLh pass and pixels through which the horizontal data connection lines DBLh do not pass may be reduced or minimized. Thus, when the same electrical signal is applied to pixels, a difference in luminance implemented in the pixels is reduced or minimized, and a display apparatus on which a high-quality image may be displayed may be implemented.

Figure 8:
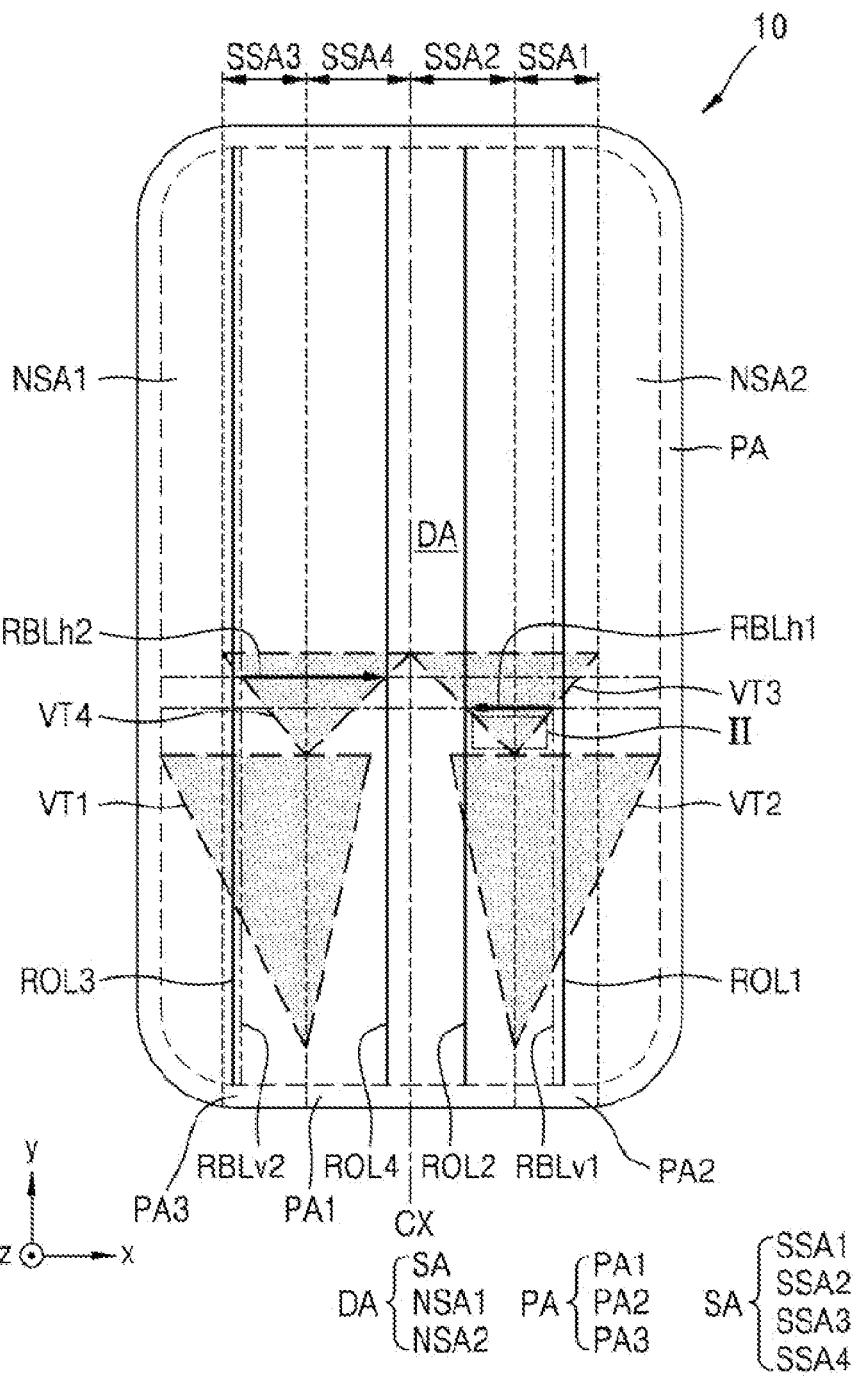
FIG. 8 is a plan view schematically illustrating a read-out line and a read-out connection line of a display apparatus according to one or more embodiments.

FIG. 8 is a plan view schematically illustrating read-out lines and read-out connection lines of the display apparatus 10 according to one or more embodiments.

Referring to FIG. 8, the display apparatus 10 may include the display area DA and the peripheral area PA. The display area DA may include the light detection area SA, and the first non-detection area NSA1 and the second non-detection area NSA2 located outside the light detection area SA. The light detection area SA may include a first sub-detection area SSA1, a second sub-detection area SSA2, a third sub-detection area SSA3, and a fourth sub-detection area SSA4. The first sub-detection area SSA1 may be arranged to be in contact with a right (+x direction) boundary of the light detection area SA, and the third sub-detection area SSA3 may be arranged to be in contact with a left (−x direction) boundary of the light detection area SA. The second sub-detection area SSA2 may be arranged between the virtual center line CX and the first sub-detection area SSA1, the virtual center line CX dividing the display area DA into two equal areas and extending in the first direction (e.g., the y direction). Similarly, the fourth sub-detection area SSA4 may be arranged between the virtual center line CX and the third sub-detection area SSA3.

The peripheral area PA may include the first peripheral area PA1 in which input lines connected to a data driver circuit are arranged, and a second peripheral area PA2 and a third peripheral area PA3, in which input lines connected to a light detection driver circuit are arranged. The second peripheral area PA2 and the third peripheral area PA3 may be arranged at opposite sides of the first peripheral area PA1, respectively, with the first peripheral area PA1 therebetween. The second peripheral area PA2 may be located to be in contact with a lower (−y direction) boundary of the first sub-detection area SSA1, and the third peripheral area PA3 may be located to be in contact with a lower (−y direction) boundary of the third sub-detection area SSA3.

On the front surface of the light detection area SA, read-out lines each extending in the first direction (e.g., the y direction) may be arranged to be approximately parallel to each other and spaced from each other in the second direction (e.g., the x direction). FIG. 8 shows an example of a case in which a first read-out line ROL1 is located in the first sub-detection area SSA1, a second read-out line ROL2 is located in the second sub-detection area SSA2, a third read-out line ROL3 is located in the third sub-detection area SSA3, and a fourth read-out line ROL4 is located in the fourth sub-detection area SSA4.

A first vertical connection line RBLv1 extending in the first direction (e.g., the y direction) may be arranged in the first sub-detection area SSA1, and a second vertical connection line RBLv2 extending in the first direction (e.g., the y direction) may be arranged in the third sub-detection area SSA3. The first vertical connection line RBLv1 and the second vertical connection line RBLv2 may be arranged to be approximately parallel to each other and spaced from each other in the second direction (e.g., the x direction).

A first horizontal connection line RBLh1 may connect the first vertical connection line RBLv1 to the second read-out line ROL2. A second horizontal connection line RBLh2 may connect the second vertical connection line RBLv2 to the fourth read-out line ROL4.

Read-out lines and vertical connection lines arranged in the first sub-detection area SSA1 and the third sub-detection area SSA3 may respectively be directly connected to input lines arranged in the second peripheral area PA2 and the third peripheral area PA3. For example, the first read-out line ROL1 and the first vertical connection line RBLv1 shown in FIG. 8 may be directly connected to an input line arranged in the second peripheral area PA2, and the third read-out line ROL3 and the second vertical connection line RBLv2 may be directly connected to an input line arranged in the third peripheral area PA3.

The read-out lines arranged in the second sub-detection area SSA2 and the fourth sub-detection area SSA4 may each be electrically connected to an input line through a corresponding vertical connection line and horizontal connection line. For example, the second read-out line ROL2 shown in FIG. 8 may be connected to an input line through the first vertical connection line RBLv1 and the first horizontal connection line RBLh1. The fourth read-out line ROL4 may be connected to an input line through the second vertical connection line RBLv2 and the second horizontal connection line RBLh2.

The first vertical connection line RBLv1 may be located to be farther away from the imaginary center line CX than the second read-out line ROL2, the imaginary center line CX dividing the display area DA into two equal areas and extending in the first direction (e.g., the y direction). The second vertical connection line RBLv2 may be located to be farther away from the imaginary center line CX than the fourth read-out line ROL4.

Contact portions in which a vertical connection line and a horizontal connection line are connected to each other and contact portion in which a horizontal connection line and a read-out line are connected to each other may be arranged along a boundary having an approximately triangular shape in a plan view. For example, a contact portion in which the first vertical connection line RBLv1 and the first horizontal connection line RBLh1 are connected to each other may be located on one side of a third imaginary triangle VT3, and a contact portion in which the second read-out line ROL2 and the first horizontal connection line RBLh1 are connected to each other may be located on another side of the third imaginary triangle VT3. A contact portion in which the second vertical connection line RBLv2 and the second horizontal connection line RBLh2 are connected to each other may be located on one side of a fourth imaginary triangle VT4, and a contact portion in which the fourth read-out line ROL4 and the second horizontal connection line RBLh2 are connected to each other may be located on another side of the fourth imaginary triangle VT4.

The third imaginary triangle VT3 may overlap the first sub-detection area SSA1 and the second sub-detection area SSA2, and the fourth imaginary triangle VT4 may overlap the third sub-detection area SSA3 and the fourth sub-detection area SSA4. With respect to the imaginary center line CX, the third imaginary triangle VT3 and the fourth imaginary triangle VT4 may be symmetrical to each other.

The third imaginary triangle VT3 may be located at an upper side (+y direction) of the second imaginary triangle VT2 described with reference to FIG. 7. The fourth imaginary triangle VT4 may be located at an upper side (+y direction) of the first imaginary triangle VT1 described with reference to FIG. 7. The first imaginary triangle VT1, the second imaginary triangle VT2, the third imaginary triangle VT3, and the fourth imaginary triangle VT4 may be arranged not to overlap each other.

A first area in which a horizontal data connection line is arranged may overlap the first imaginary triangle VT1 and the second imaginary triangle VT2, and a second area in which a horizontal connection line may overlap the third virtual triangle VT3 and the fourth imaginary triangle VT4. Accordingly, the first area in which the horizontal data connection line is arranged may not overlap the second area in which the horizontal connection line is arranged.

Figure 9A:
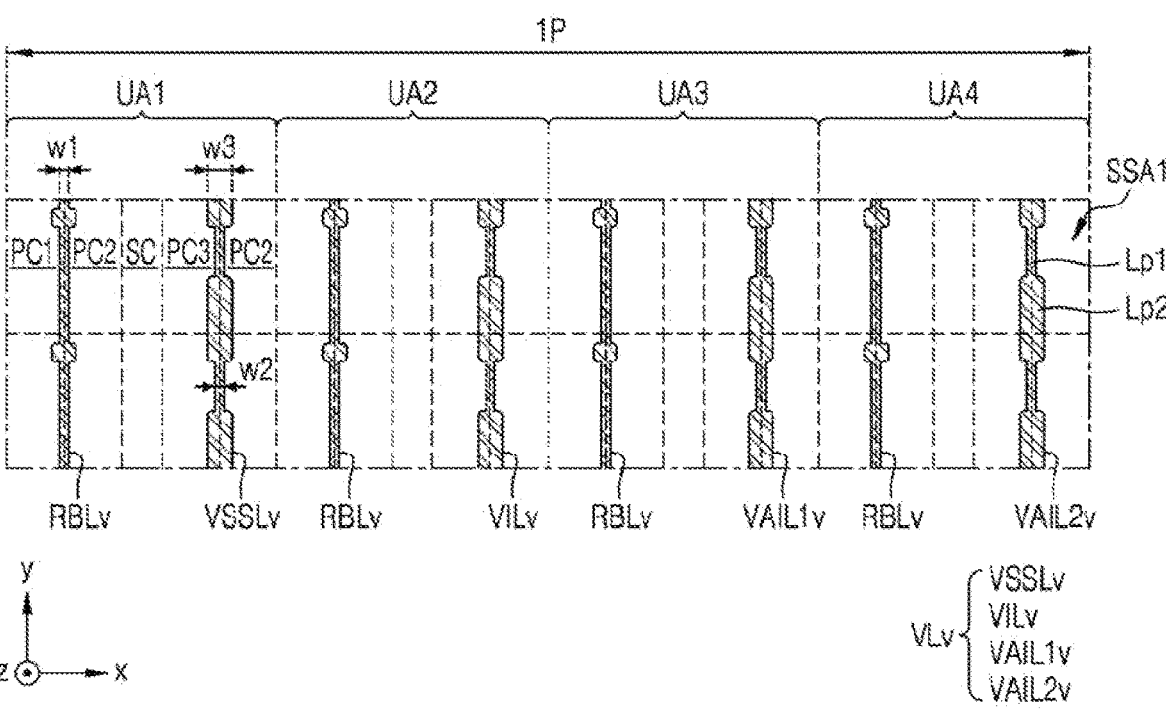
Figure 9B:
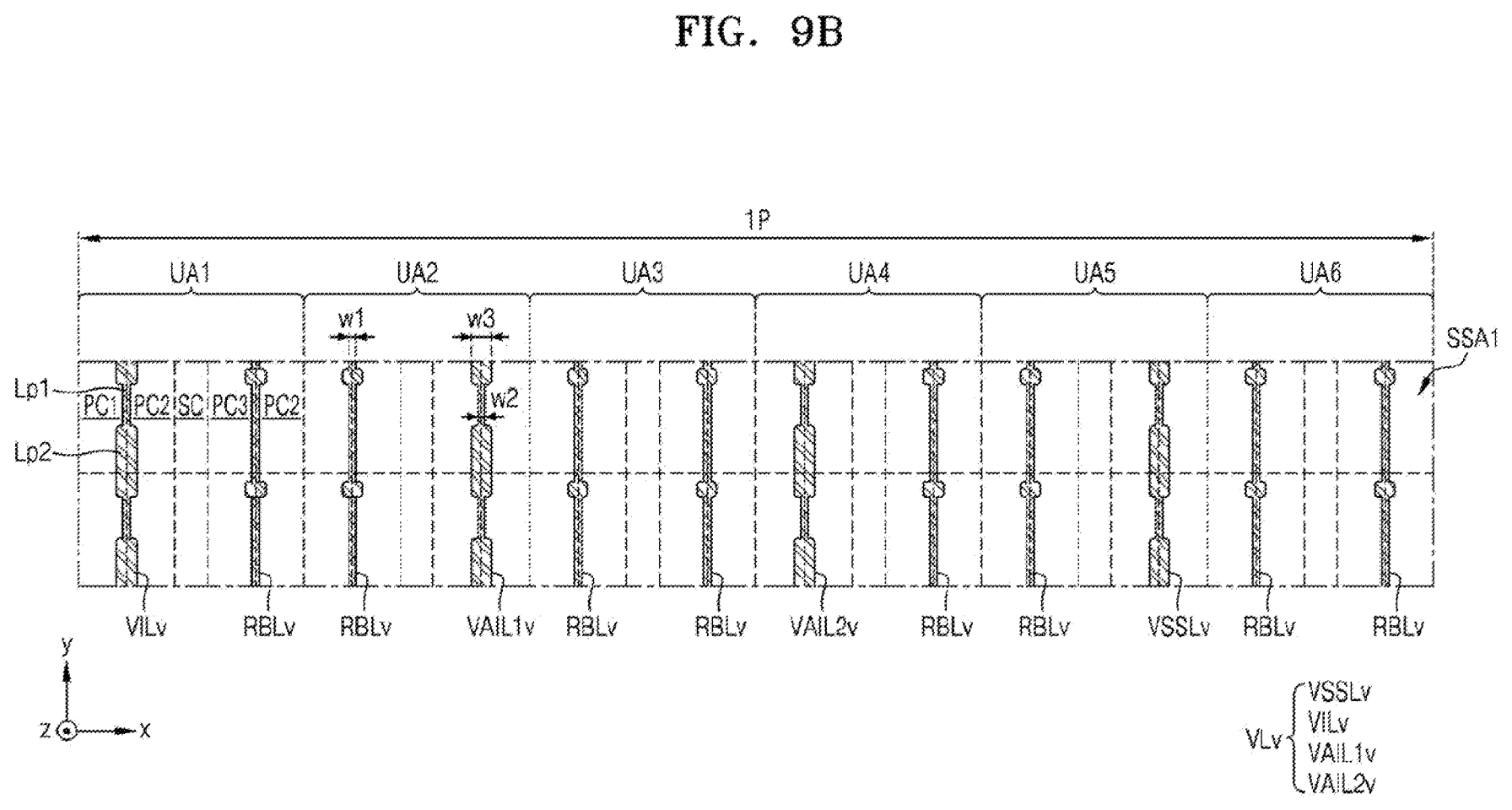

FIGS. 9A and 9B are plan views schematically illustrating a portion of a display apparatus according to one or more embodiments. FIGS. 9A and 9B are diagrams for describing one period 1P of an arrangement order in which vertical voltage lines VLv and vertical connection lines RBLv are arranged.

Referring to FIG. 9A, a first unit area UA1 to a fourth unit area UA4 may be sequentially arranged in the second direction (e.g., the x direction) in the one period 1P. One unit area may include one light detection circuit SC and two pairs of pixel circuits arranged at opposite sides of the light detection circuit SC. For example, one unit area may include a first pixel circuit PC1, a second pixel circuit PC2, the light detection circuit SC, a third pixel circuit PC3, and a second pixel circuit PC2, which are sequentially stacked in the second direction (e.g., the x direction). At one side of the light detection circuit SC, the first pixel circuit PC1 and the second pixel circuit PC2 may be arranged to form a pair of pixel circuits, and at the other side of the light detection circuit SC, the third pixel circuit PC3 and the second pixel circuit PC2 may be arranged to form a pair of pixel circuits.

Here, the first pixel circuit PC1 may be electrically connected to a light-emitting diode emitting light of a first color, the second pixel circuit PC2 may be electrically connected to a light-emitting diode emitting light of a second color, and the third pixel circuit PC3 may be electrically connected to a light-emitting diode emitting light of a third color. In one or more embodiments, the first color may be red, the second color may be green, and the third color may be blue. However, one or more embodiments are not limited thereto.

In one unit area, one vertical connection line RBLv and one vertical voltage line VLv may be arranged. Each of the vertical connection line RBLv and the vertical voltage line VLv may be arranged between pixel circuits that are in contact with each other in the second direction (e.g., the x direction), so as to form a pair of pixel circuits. For example, the vertical connection line RBLv may be arranged between the first pixel circuit PC1 and the second pixel circuit PC2, which form a first pair of pixel circuits, and the vertical voltage line VLv may be arranged between the third pixel circuit PC3 and the second pixel circuit PC2, which form a second pair of pixel circuits. Accordingly, one vertical connection line RBLv may be arranged between two adjacent vertical voltage lines VLv.

The vertical connection line RBLv may extend in the first direction (e.g., the y direction) and may have a first width w1 in the second direction (e.g., the x direction). The vertical voltage line VLv may extend in the first direction (e.g., the y direction), and may include a first portion Lp1 having a second width w2 in the second direction (e.g., the x direction), and a second portion Lp2 having a third width w3 in the second direction (e.g., the x direction). The second width w2 of the first portion Lp1 may be less than the third width w3 of the second portion Lp2.

In one or more embodiments, the second width w2 of the first portion Lp1 may be substantially equal to the first width w1 of the vertical connection line RBLv, or may be greater than the first width w1 of the vertical connection line RBLv. The third width w3 of the second portion Lp2 may be greater than the first width w1 of the vertical connection line RBLv. Accordingly, an area of one vertical voltage line VLv may be greater than an area of one vertical connection line RBLv. For example, the area of the vertical voltage line VLv may be about two to about four times the area of the vertical connection line RBLv.

When the vertical connection lines RBLv are arranged, the number of vertical voltage lines VLv arranged during one period 1P may be reduced by half compared to a case in which the vertical connection lines RBLv are not arranged. Accordingly, in a display apparatus according to one or more embodiments, the area of the vertical voltage line VLv may be increased to compensate for an increase in resistance due to reduction in the number of vertical voltage lines VLv.

The vertical voltage line VLv may include a vertical common voltage line VSSLv, a first vertical voltage line VILv, a second vertical voltage line VAIL1v, and a third vertical voltage line VAIL2v. The common voltage ELVSS (see FIG. 4) may be applied to the vertical common voltage line VSSLv, and the first initialization voltage $V_{INT}$ (see FIG. 4) may be applied to the first vertical voltage line VILv.

In one or more embodiments, a magnitude of the second initialization voltage $A_{INT}$ applied to the pixel circuit PC (see FIG. 4) may differ depending on an emission characteristic of the light-emitting diode ED (see FIG. 4). For example, a (2-1)th initialization voltage may be applied to the first pixel circuit PC1 emitting light of the first color, and a (2-2)th initialization voltage may be applied to the second pixel circuit PC2 emitting light of the second color and the third pixel circuit PC3 emitting light of the third color. Magnitudes of the (2-1)th initialization voltage and the (2-2)th initialization voltage may be different from each other. In this case, the (2-1)th initialization voltage may be applied to the second vertical voltage line VAIL1v, and the (2-2)th initialization voltage may be applied to the third vertical voltage line VAIL2v.

The vertical common voltage line VSSLv, the first vertical voltage line VILv, the second vertical voltage line VAIL1v, and the third vertical voltage line VAIL2v may be sequentially repeatedly arranged in the second direction (e.g., the x direction). The vertical voltage line VLv arranged in the first unit area UA1 may be the vertical common voltage line VSSLv, the vertical voltage line VLv arranged in the second unit area UA2 may be the first vertical voltage line VILv, the vertical voltage line VLv arranged in the third unit area UA3 may be the second vertical voltage line VAIL1v, and the vertical voltage line VLv arranged in the fourth unit area UA4 may be the third vertical voltage line VAIL2v. However, one or more embodiments are not limited thereto, and an arrangement order of the vertical common voltage line VSSLv, the first vertical voltage line VILv, the second vertical voltage line VAIL1v, and the third vertical voltage line VAIL2v may be variously changed depending on the design.

Referring to FIG. 9B, the first unit area UA1 to the sixth unit area UA6 may be sequentially arranged in the second direction (e.g., the x direction) during one period 1P.

In one unit area, one vertical connection line RBLv and one vertical voltage line VLv may be arranged, or two vertical connection lines RBLv may be arranged. Each of the vertical connection line RBLv and the vertical voltage line VLv may be arranged between pixel circuits that are in contact with each other in the second direction (e.g., the x direction) to form a pair of pixel circuits. For example, each of the first unit area UA1 and the fourth unit area UA4 may include one vertical connection line RBLv and one vertical voltage line VLv, each of the second unit area UA2 and the fifth unit area UA5 may include one vertical voltage line VLv and one vertical connection line RBLv, and each of the third unit area UA3 and the sixth unit area UA6 may include two vertical connection lines RBLv. Accordingly, two vertical connection lines RBLv may be arranged between two adjacent vertical voltage lines VLv.

The vertical connection line RBLv may extend in the first direction (e.g., the y direction) and may have a first width w1 in the second direction (e.g., the x direction). The vertical voltage line VLv may extend in the first direction (e.g., the y direction), and may include the first portion Lp1 having the second width w2 in the second direction (e.g., the x direction), and the second portion Lp2 having the third width w3 in the second direction (e.g., the x direction). The second width w2 of the first portion Lp1 may be less than the third width w3 of the second portion Lp2.

In one or more embodiments, the second width w2 of the first portion Lp1 may be substantially equal to the first width w1 of the vertical connection line RBLv, or may be greater than the first width w1 of the vertical connection line RBLv. The third width w3 of the second portion Lp2 may be greater than the first width w1 of the vertical connection line RBLv. Accordingly, an area of one vertical voltage line VLv may be greater than an area of one vertical connection line RBLv. For example, the area of the vertical voltage line VLv may be about two to about four times the area of the vertical connection line RBLv.

When the vertical connection lines RBLv are arranged, the number of vertical voltage lines VLv arranged during one period 1P may be reduced to one-third compared to a case in which the vertical connection lines RBLvs are not arranged. Accordingly, in a display apparatus according to one or more embodiments, the area of the vertical voltage line VLv may be increased to compensate for an increase in resistance due to reduction in the number of vertical voltage lines VLv.

The vertical voltage line VLv may include the vertical common voltage line VSSLv, the first vertical voltage line VILv, the second vertical voltage line VAIL1v, and the third vertical voltage line VAIL2v. The common voltage ELVSS (see FIG. 4) may be applied to the vertical common voltage line VSSLv, and the first initialization voltage $V_{INT}$ (see FIG. 4) may be applied to the first vertical voltage line VILv. The (2-1)th initialization voltage may be applied to the second vertical voltage line VAIL1v, and the (2-2)th initialization voltage may be applied to the third vertical voltage line VAIL2v.

The vertical common voltage line VSSLv, the first vertical voltage line VILv, the second vertical voltage line VAIL1v, and the third vertical voltage line VAIL2v may be sequentially repeatedly arranged in the second direction (e.g., the x direction). For example, the vertical voltage line VLv arranged in the first unit area UA1 may be the first vertical voltage line VILv, the vertical voltage line VLv arranged in the second unit area UA2 may be the second vertical voltage line VAIL1v, the vertical voltage line VLv arranged in the fourth unit area UA4 may be the third vertical voltage line VAIL2v, and the vertical voltage line VLv arranged in the fifth unit area UA5 may be the vertical common voltage line VSSLv. However, one or more embodiments are not limited thereto, and an arrangement order of the vertical common voltage line VSSLv, the first vertical voltage line VILv, the second vertical voltage line VAIL1v, and the third vertical voltage line VAIL2v may be variously changed depending on the design.

Figure 10:
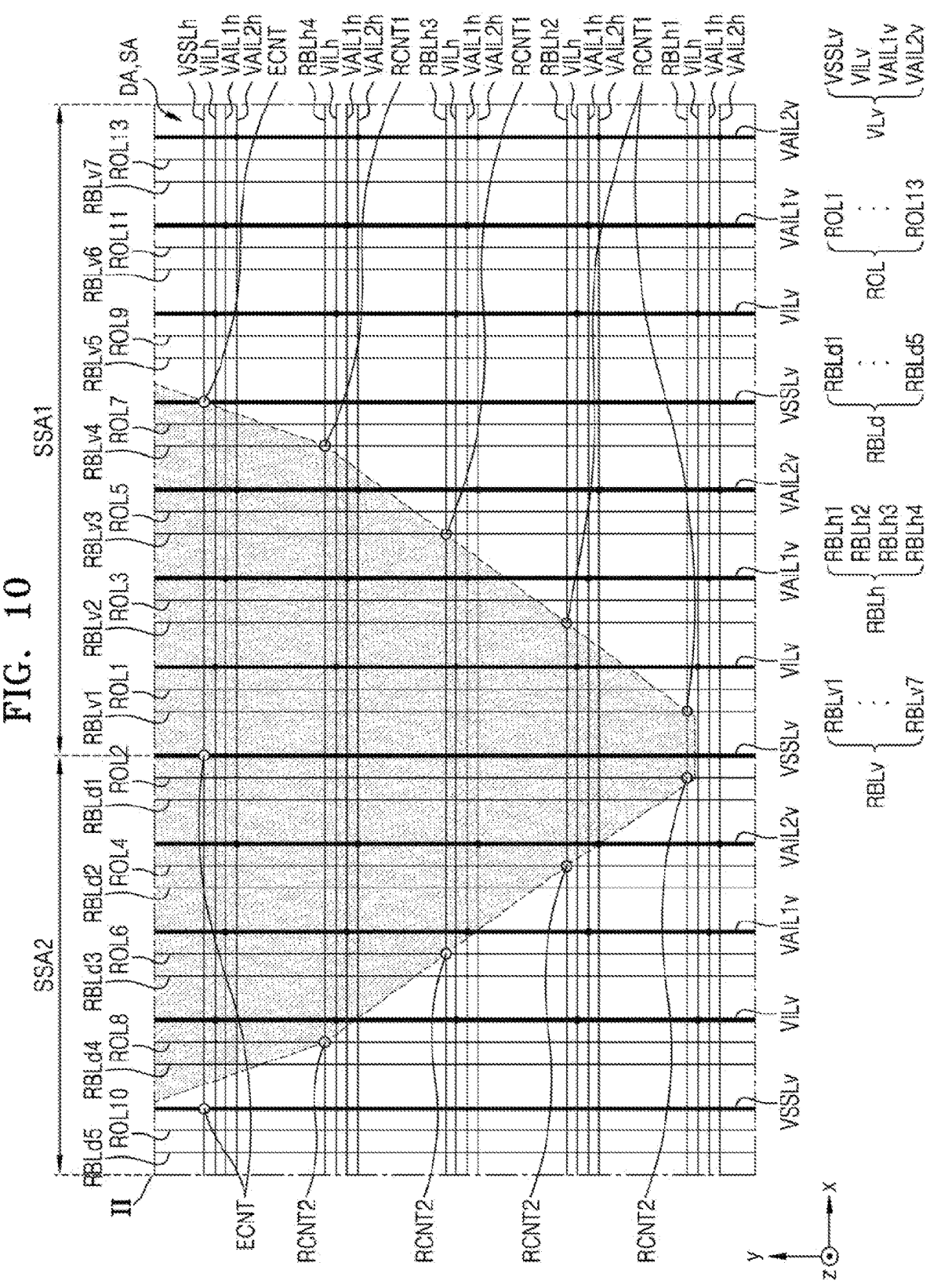
FIG. 10 is a diagram schematically illustrating lines of a display apparatus according to one or more embodiments.

FIG. 10 is a diagram schematically illustrating lines of a display apparatus according to one or more embodiments. FIG. 10 is a diagram for describing lines arranged in region II of the display apparatus 10 shown in FIG. 8. FIG. 10 shows a case in which one vertical line RBLv is arranged between adjacent vertical voltage lines VLv, as described with reference to FIG. 9A.

Referring to FIG. 10, the display area DA may include the light detection area SA, and the light detection area SA may include the first sub-detection area SSA1 and the second sub-detection area SSA2.

The vertical voltage lines VLv each extending in the first direction (e.g., the y direction) may be arranged to be spaced from each other in the second direction (e.g., the x direction) across the entire surface of the display area DA. The vertical voltage lines VLv may include the vertical common voltage line VSSLv, the first vertical voltage line VILv, the second vertical voltage line VAIL1v, and the third vertical voltage line VAIL2v. As described with reference to FIG. 9A, the vertical voltage line VAIL1v, and the third vertical voltage line VAIL2v may be sequentially arranged in the second direction (e.g., the x direction) during one period 1P.

A first horizontal voltage line VILh, a second horizontal voltage line VAIL1h, and a third horizontal voltage line VAIL2h each extending in the second direction (e.g., the x direction) may be arranged to be spaced from each other in the first direction (e.g., the y direction) across the entire surface of the display area DA. Each of the first horizontal voltage line VILh, the second horizontal voltage line VAIL1h, and the third horizontal voltage line VAIL2h may be arranged for each pixel row including pixels arranged in the second direction (e.g., the x direction).

The first vertical voltage line VILv may be connected to the first horizontal voltage line VILh extending in the second direction (e.g., the x direction), and the first vertical voltage line VILv and the first horizontal voltage line VILh may constitute a mesh structure. The second vertical voltage line VAIL1v may be connected to the second horizontal voltage line VAIL1h extending in the second direction (e.g., the x direction), so as to constitute a mesh structure. The third vertical voltage line VAIL2v may be connected to the third horizontal voltage line VAIL2h extending in the second direction (e.g., the x direction), so as to constitute a mesh structure.

In FIG. 10, the third horizontal voltage line VAIL2h, the second horizontal voltage line VAIL1h, the first horizontal voltage line VILh, and the horizontal common voltage line VSSLh are sequentially arranged for each pixel row. However, one or more embodiments are not limited thereto. An arrangement order of the horizontal common voltage line VSSLh, the first horizontal voltage line VILh, the second horizontal voltage line VAIL1h, and the third horizontal voltage line VAIL2h may be variously changed depending on the design.

The read-out lines ROL each extending in the first direction (e.g., the y direction) may be arranged to be spaced from each other in the second direction (e.g., the x direction) across the entire surface of the light detection area SA. The first to 13$^{th}$ read-out lines ROL1 to ROL13 may be arranged in the light detection area SA. In one or more embodiments, the odd-numbered read-out lines ROL1, ROL3, . . . , ROL13 may be arranged in the first sub-detection area SSA1, and may be directly connected to input lines connected to a light-detection driver circuit. The even-numbered read-out lines ROL2, ROL4, . . . , ROL10 may be connected to input lines through the vertical connection lines RBLv and the horizontal connection lines RBLh. The read-out lines ROL may be arranged to overlap the light detection circuit SC (see FIG. 9A).

In the first sub-detection area SSA1, the vertical connection lines RBLv each extending in the first direction (e.g., the y direction) may be arranged to be spaced from each other in the second direction (e.g., the x direction). FIG. 10 shows that the first sub detection area SSA1 includes the first vertical connection line RBLv1 to the seventh vertical connection line RBLv7.

In the second sub-detection area SSA2, vertical dummy lines RBLd each extending in the first direction (e.g., the y direction) may be arranged to be spaced from each other in the second direction (e.g., the x direction). The vertical dummy lines RBLd may not be electrically connected to the read-out lines ROL or the horizontal connection lines RBLh. Accordingly, the vertical dummy lines RBLd may be omitted. However, in order for pixels arranged in the second sub-detection area SSA2 and pixels arranged in the first sub-detection area SSA1 to have identical or similar structures as much as possible, the vertical dummy lines RBLd may be arranged in the second sub-detection area SSA2. Through this, a display apparatus on which a high-quality image is displayed may be implemented.

The horizontal common voltage line VSSLh and the horizontal connection lines RBLh each extending in the second direction (e.g., the x direction) may be arranged to be spaced from each other in the first direction (e.g., the y direction) across the entire surface of the display area DA. For each pixel circuit row including pixel circuits arranged in the second direction (e.g., the x direction), any one of the horizontal common voltage line VSSLh and the horizontal connection line RBLh may be arranged. For example, the first horizontal connection line RBLh1 may be arranged in a first pixel circuit row, the second horizontal connection line RBLh2 may be arranged in a second pixel circuit row, a third horizontal connection line RBLh3 may be arranged in a third pixel circuit row, a fourth horizontal connection line RBLh4 may be arranged in a fourth pixel circuit row, and the horizontal common voltage line VSSLh may be arranged in a fifth pixel circuit row.

The horizontal connection lines RBLh may connect the vertical connection lines RBLv arranged in the first sub-detection area SSA1 to the read-out lines ROL arranged in the second sub-detection area SSA2. For example, one end (in a +x direction) of each of the first horizontal connection line RBLh1, the second horizontal connection line RBLh2, the third horizontal connection line RBLh3, and the fourth horizontal connection line RBLh4 may be electrically connected via a fifth contact hole RCNT1 to the first vertical connection line RBLv1, the second vertical connection line RBLv2, the third vertical connection line RBLv3, and the fourth vertical connection line RBLv4, respectively, and the other end (in-x direction) of each of the first horizontal connection line RBLh1, the second horizontal connection line RBLh2, the third horizontal connection line RBLh3, and the fourth horizontal connection line RBLh4 may be electrically connected via a sixth contact hole RCNT2 to the second read-out line ROL2, the fourth read-out line ROL4, the sixth read-out line ROL6, and the eighth read-out line ROL8.

The horizontal common voltage lines VSSLh may be electrically connected to the vertical common voltage lines VSSLv arranged in the display area DA via a sixth contact hole ECNT. The horizontal common voltage lines VSSLh and the vertical common voltage lines VSSLv may cross each other and constitute a mesh structure.

Figure 11:
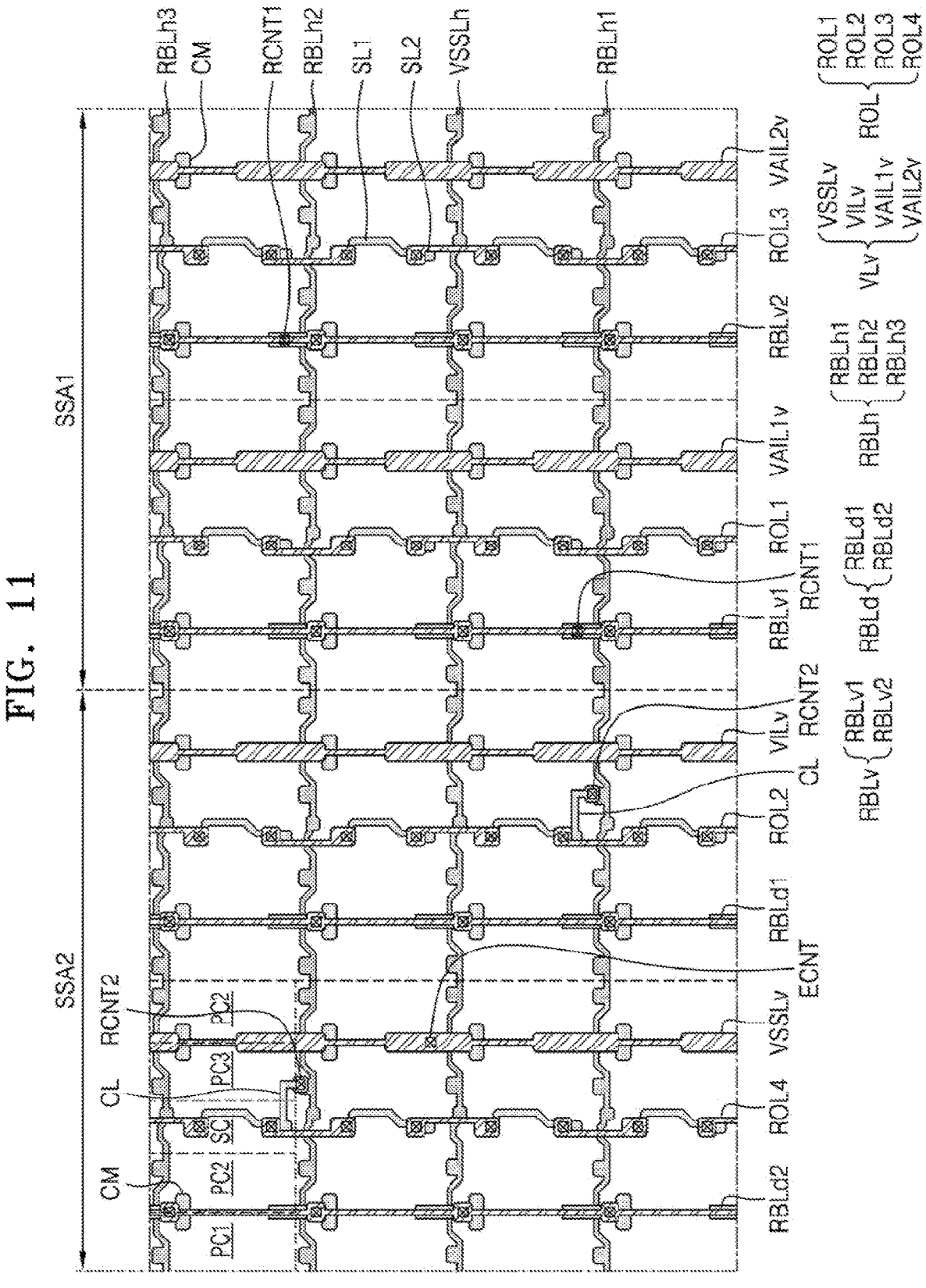
FIG. 11 is a plan view schematically illustrating a portion of a display apparatus according to one or more embodiments.

FIG. 11 is a plan view schematically illustrating a portion of a display apparatus according to one or more embodiments. For convenience of description, FIG. 11 shows only the vertical connection lines RBLv, the horizontal connection lines RBLh, the vertical dummy lines RBLd, the vertical voltage lines VLv, and the horizontal common voltage lines VSSLh.

Referring to FIG. 11, the vertical voltage lines VLv, the vertical connection lines RBLv, and the read-out lines ROL may be arranged in the first sub-detection area SSA1, and the vertical voltage lines VLv, the vertical dummy lines RBLd, and the read-out lines ROL may be arranged in the second sub-detection area SSA2.

The vertical voltage lines VLv may include the vertical common voltage line VSSLv, the first vertical voltage line VILv, the second vertical voltage line VAIL1v, and the third vertical voltage line VAIL2v. The vertical common voltage line VSSLv, the first vertical voltage line VILv, the second vertical voltage line VAIL1v, and the third vertical voltage line VAIL2v may be sequentially arranged in the second direction (e.g., the x direction).

In the first sub-detection area SSA1, at least one vertical connection line RBLv may be arranged between adjacent vertical voltage lines VLv. In the second sub-detection area SSA2, at least one vertical dummy line RBLd may be arranged between adjacent vertical voltage lines VLv. Each of the vertical connection line RBLv and the vertical voltage line VLv may be arranged between pixel circuits that are in contact with each other in the second direction (e.g., the x direction) to constitute a pair of pixel circuits. The vertical voltage line VLv may have a width greater than a width of the vertical connection line RBLv in the second direction (e.g., the x direction). For example, an area of the vertical voltage line VLv may be about two to about four times an area of the vertical connection line RBLv.

The vertical common voltage line VSSLv, the first vertical voltage line VILv, the second vertical voltage line VAIL1v, the third vertical voltage line VAIL2v, the vertical connection line RBLv, and the vertical dummy line RBLd may be arranged on the same layer.

Connection electrodes CM may be arranged to overlap each of the vertical common voltage line VSSLv, the first vertical voltage line VILv, the second vertical voltage line VAIL1v, the third vertical voltage line VAIL2v, the vertical connection line RBLv, and the vertical dummy line RBLd. The connection electrodes CM may electrically connect each of the vertical common voltage line VSSLv, the first vertical voltage line VILv, the second vertical voltage line VAIL1v, the third vertical voltage line VAIL2v, and the vertical connection line RBLv to a corresponding lower line.

The read-out lines ROL may be arranged to overlap the light detection circuit SC. In FIG. 11, the first read-out line ROL1 and the third read-out line ROL3 are arranged in the first sub-detection area SSA1, and the second read-out line ROL2 and the fourth read-out line ROL4 are arranged in the second sub-detection area SSA2. The first read-out line ROL1 and the third read-out line ROL3 may be directly connected to or integrally provided as a single body with input lines connected to a light detection driver circuit. The second read-out line ROL2 may be connected to an input line via the first horizontal connection line RBLv1 and the first horizontal connection line RBLh1, and the fourth read-out line ROL4 may be connected to an input line via the second vertical connection line RBLv2 and the second horizontal connection line RBLh2.

Each read-out line ROL may include a first sub-line SL1 and a second sub-line SL2. The first sub-line SL1 and the second sub-line SL2 may be disposed on different layers from each other. For example, the first sub-line SL1 may be arranged between the first planarization layer 206 (see FIG. 5) and the second planarization layer 207 (see FIG. 5), and the second sub-line SL2 may be arranged between the second planarization layer 207 (see FIG. 5) and the third planarization layer 208 (see FIG. 5). The first sub-line SL1 and the second sub-line SL2 may be alternately arranged in the first direction (e.g., the y direction), and may be electrically connected to each other via contact holes passing through the second planarization layer 207.

The horizontal common voltage line VSSLh and the horizontal connection lines RBLh each extending in the second direction (e.g., the x direction) may be arranged to be spaced from each other in the first direction (e.g., the y direction). For each pixel circuit row including pixel circuits arranged in the second direction (e.g., the x direction), any one of the common voltage line VSSLh and the horizontal connection line RBLh may be arranged. For example, the first horizontal connection line RBLh1 may be arranged in the first pixel circuit row, the horizontal common voltage line VSSLh may be arranged in the second pixel circuit row, the second horizontal connection line RBLh2 may be arranged in the third pixel circuit row, and the third horizontal connection line RBLh3 may be arranged in the fourth pixel circuit row.

The horizontal connection lines RBLh and the horizontal common voltage lines VSSLh may be disposed on a first conductive layer, and the vertical connection lines RBLv and the vertical voltage lines VLv may be disposed on a second conductive layer on the first conductive layer. For example, the horizontal connection lines RBLh and the horizontal common voltage lines VSSLh may be arranged between the interlayer insulating layer 205 (see FIG. 5) and the first planarization layer 206 (see FIG. 5), and the vertical common voltage line VSSLv, the first vertical voltage line VILv, the second vertical voltage line VAIL1v, the third vertical voltage line VAIL2v, and the vertical connection line RBLv may be arranged between the second planarization layer 207 (see FIG. 5) and the third planarization layer 208 (see FIG. 5). In one or more embodiments, the connection electrodes CM may be disposed on a third conductive layer between the first conductive layer and the second conductive layer. The connection electrodes CM may be arranged between the first planarization layer 206 (see FIG. 5) and the second planarization layer 207 (see FIG. 5).

The horizontal connection lines RBLh may connect the vertical connection lines RBLv arranged in the first sub-detection area SSA1 to the read-out lines ROL arranged in the second sub-detection area SSA2. For example, one end (in a +x direction) of each of the first horizontal connection line RBLh1, the second horizontal connection line RBLh2, and the third horizontal connection line RBLh3 may be electrically connected via the fifth contact hole RCNT1 to the first vertical connection line RBLv1, the second vertical connection line RBLv2, and the third vertical connection line RBLv3, respectively, and the other end (in-x direction) of each of the first horizontal connection line RBLh1, the second horizontal connection line RBLh2, and the third horizontal connection line RBLh3 may be electrically connected via a sixth contact hole RCNT2 to the second read-out line ROL2, the fourth read-out line ROL4, and the sixth read-out line ROL6. Here, the fifth contact hole RCNT1 may pass through the first planarization layer 206 (see FIG. 5), and connect the connection electrode CM and the horizontal connection line RBLh, which are connected to the vertical connection line RBLv, to each other via the fifth contact hole RCNT1. The sixth contact hole RCNT2 may pass through the first planarization layer 206 (see FIG. 5) and connect the horizontal connection line RBLh to a contact line CL via the sixth contact hole RCNT2. The contact line CL may be integrally provided as a single body with the first sub-line SL1 of the read-out line ROL.

The horizontal common voltage line VSSLh may be electrically connected to the vertical common voltage line VSSLv via the seventh contact hole ECNT. The horizontal common voltage lines VSSLh and the vertical common voltage lines VSSLv may cross each other and constitute a mesh structure.

Figure 12:
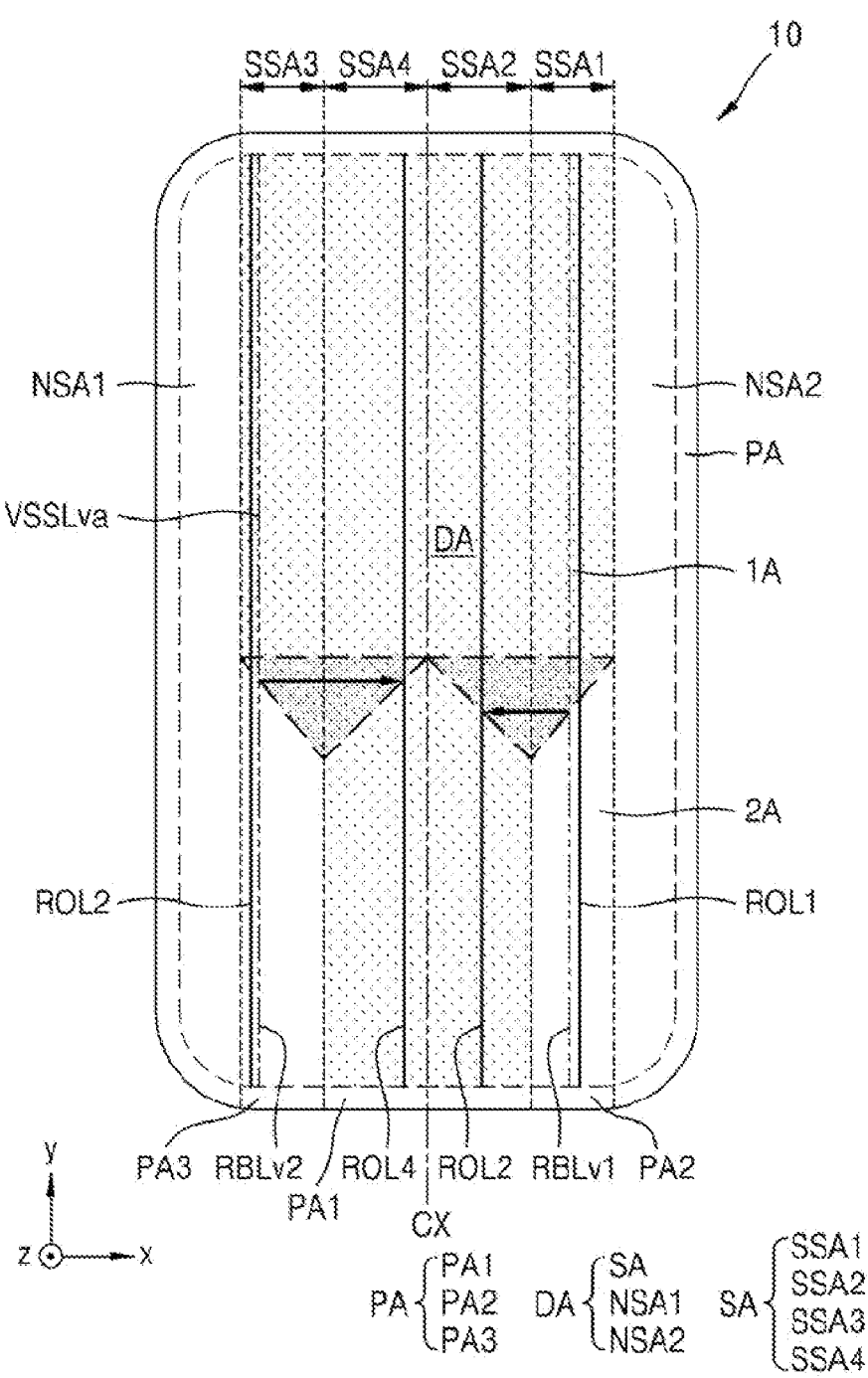
FIG. 12 is a diagram schematically illustrating a read-out line, a read-out connection line, and an auxiliary common voltage line of a display apparatus according to one or more embodiments.

FIG. 12 is a diagram schematically illustrating read-out lines, read-out connection lines, and auxiliary common voltage lines of the display apparatus 10 according to one or more embodiments. The display apparatus 10 shown in FIG. 12 is similar to the display apparatus 10 shown in FIG. 8, but differs in that the display apparatus shown in FIG. 12 further includes a first auxiliary common voltage line VSSLva extending in the first direction (e.g., the y direction). Descriptions of the same or similar configurations are omitted below, and differences are mainly described.

Referring to FIG. 12, the display apparatus 10 may include the display area DA and the peripheral area PA. The display area DA may include the light detection area SA, and the first non-detection area NSA1 and the second non-detection area NSA2 located outside the light detection area SA. The light-detection area SA may include the first sub-detection area SSA1, the second sub-detection area SSA2, the third sub-detection area SSA3, and the fourth sub-detection area SSA4. The first sub-detection area SSA1 may be arranged to be in contact with a right (+x direction) boundary of the light detection area SA, and the third sub-detection area SSA3 may be arranged to be in contact with a left (−x direction) boundary of the light detection area SA. The second sub-detection area SSA2 may be arranged between the imaginary center line CX, which divides the display area DA into two equal areas and extends in the first direction (e.g., the y direction), and the first sub-detection area SSA1. Similarly, the fourth sub-detection area SSA4 may be arranged between the imaginary center line CX and the third sub-detection area SSA3.

The light detection area SA may include a first line area 1A in which the first auxiliary common voltage lines VSSLva are arranged, and a second line area 2A outside the first line area 1A. The first line area 1A may overlap a portion of the first sub-detection area SSA1, a portion of the third sub-detection area SSA3, the second sub-detection area SSA2, and the fourth sub-detection area SSA4. For example, the first auxiliary common voltage lines VSSLva may be arranged in an area in which the first sub-detection area SSA1 and the first line area 1A overlap each other and an area in which the third sub-detection area SSA3 and the first line area 1A overlap each other, and the vertical connection lines RBLv may be arranged in an area in which the first sub-detection area SSA1 and the second line area 2A overlap each other and an area in which the third sub-detection area SSA3 and the second line area 2A overlap each other.

In the second sub-detection area SSA2 and the fourth sub-detection area SSA4, the first auxiliary common voltage lines VSSLva may each extend from a lower (−y direction) boundary of the light detection area SA to an upper (+y direction) boundary of the light detection area SA so as to cross the light detection area SA.

In the first sub-detection area SSA1 and the third sub-detection area SSA3, each of the first auxiliary common voltage lines VSSLva may have the same extension axis as a corresponding vertical connection line, and may be separated by being spaced in the first direction (e.g., the y direction) from the corresponding vertical connection line.

The common voltage ELVSS (see FIG. 4) may be applied to the first auxiliary common voltage lines VSSLva. Accordingly, when lines not used as the vertical connection line RBLv are used as the first auxiliary common voltage line VSSLva, a voltage drop (IR-drop) phenomenon of the common voltage ELVSS (see FIG. 4) may be prevented or reduced, so that a display apparatus on which a high-quality image is displayed may be implemented.

Figure 13A:
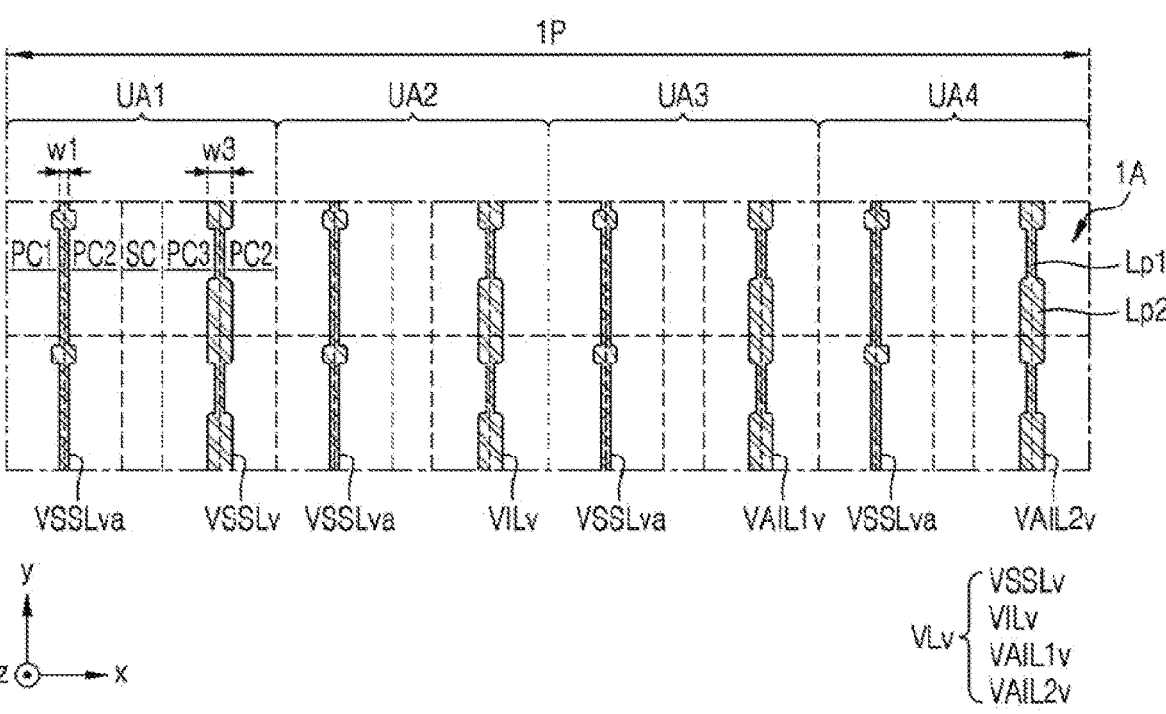
FIGS. 13A and 13B are plan views schematically illustrating a portion of a display apparatus according to one or more embodiments.
Figure 13B:
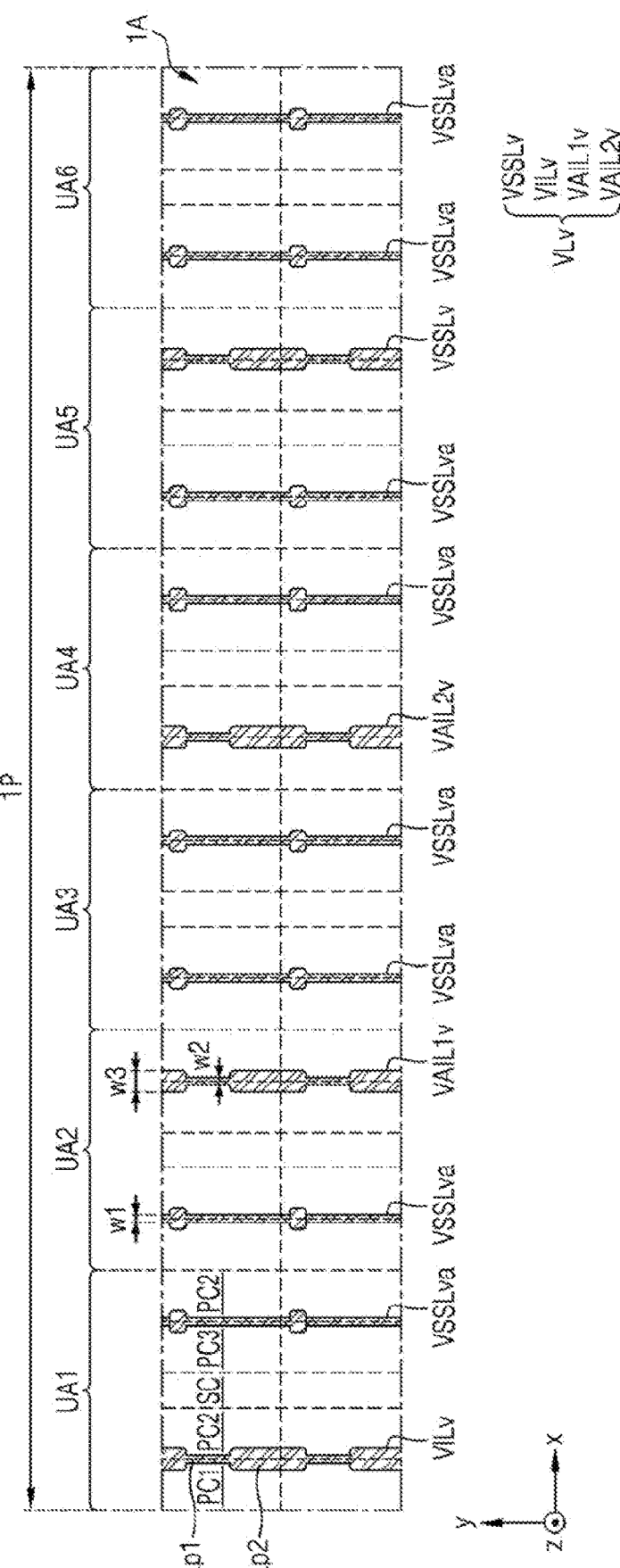

FIGS. 13A and 13B are plan views schematically illustrating a portion of a display apparatus according to one or more embodiments. FIGS. 13A and 13B are diagrams for describing one period 1P in an arrangement order of the vertical voltage lines VLv arranged in the first line area 1A in FIG. 12.

Referring to FIG. 13A, the first unit area UA1 to the fourth unit area UA4 may be sequentially arranged in the second direction (e.g., the x direction) during the one period 1P. One unit area may include one light detection circuit SC and two pairs of pixel circuits arranged at opposite sides of the light detection circuit SC. For example, one unit area may include the first pixel circuit PC1, the second pixel circuit PC2, the light detection circuit SC, the third pixel circuit PC3, and the second pixel circuit PC2, which are sequentially arranged in the second direction (e.g., the x direction). At one side of the light detection circuit SC, the first pixel circuit PC1 and the second pixel circuit PC2 constitute one pair of pixel circuits, and at the other side of the light detection circuit SC, the third pixel circuit PC3 and the second pixel circuit PC2 may constitute one pair of pixel circuits.

In one unit area, one first auxiliary common voltage line VSSLva and one vertical voltage line VLv may be arranged. Each of the first auxiliary common voltage line VSSLva and the vertical voltage line VLv may be arranged between pixel circuits that are in contact with each other in the second direction (e.g., the x direction) to constitute a pair of pixel circuits. For example, the first auxiliary common voltage line VSSLva may be arranged between the first pixel circuit PC1 and the second pixel circuit PC2 that constitute a first pair of pixel circuits, and the vertical voltage line VLv may be arranged between the third pixel circuit PC3 and the second pixel circuit PC2 that constitute a second pair of pixel circuits. Accordingly, one first auxiliary common voltage line VSSLva may be arranged between two adjacent vertical voltage lines VLv.

The vertical voltage line VLv may include the vertical common voltage line VSSLv, the first vertical voltage line VILv, the second vertical voltage line VAIL1$v$, and the third vertical voltage line VAIL2$v$. The common voltage ELVSS (see FIG. 4) may be applied to the vertical common voltage line VSSLv, and the first initialization voltage V$_{INT}$ (see FIG. 4) may be applied to the first vertical voltage line VILv. Magnitudes of the (2-1)th initialization voltage and the (2-2)th initialization voltage may be different from each other. In this case, the (2-1)th initialization voltage may be applied to the second vertical voltage line VAIL1$v$, and the (2-2)th initialization voltage may be applied to the third vertical voltage line VAIL2$v$. An arrangement order of the vertical common voltage line VSSLv, the first vertical voltage line VILv, the second vertical voltage line VAIL1$v$, and the third vertical voltage line VAIL2$v$ may be variously changed depending on the design.

Referring to FIG. 13B, the first unit area UA1 to the sixth unit area UA6 may be sequentially arranged in the second direction (e.g., the x direction) during the one period 1P.

In one unit area, one first auxiliary common voltage line VSSLva and one vertical voltage line VLv may be arranged, or two first auxiliary common voltage lines VSSLva may be arranged. Each of the first auxiliary common voltage lines VSSLva and the vertical voltage line VLv may be arranged between pixel circuits that are in contact with each other in the second direction (e.g., the x direction) so as to constitute a pair of pixel circuits. For example, each of the first unit area UA1 and the fourth unit area UA4 may include one first auxiliary common voltage line VSSLva and one vertical voltage line VLv, each of the second unit area UA2 and the fifth unit area UA5 may include one vertical voltage line VLv and one first auxiliary common voltage line VSSLva, and each of the third unit area UA3 and the sixth unit area UA6 may include two first auxiliary common voltage lines VSSLva. Accordingly, two first auxiliary common voltage lines VSSLva may be arranged between two adjacent vertical voltage lines VLv.

The first auxiliary common voltage line VSSLva may extend in the first direction (e.g., the y direction), and may have the first width w1 in the second direction (e.g., the x direction). The vertical voltage line VLv may extend in the first direction (e.g., the y direction), and may include the first portion Lp1 having the second width w2 in the second direction (e.g., the x direction), and the second portion Lp2 having the third width w3 in the second direction (e.g., the x direction). The second width w2 of the first portion Lp1 may be less than the third width w3 of the second portion Lp2.

In one or more embodiments, the second width w2 of the first portion Lp1 may be substantially equal to the first width w1 of the first auxiliary common voltage line VSSLva, or may be greater than the first width w1 of the first auxiliary common voltage line VSSLva. The third width w3 of the second portion Lp2 may be greater than the first width w1 of the first auxiliary common voltage line VSSLva. Accordingly, an area of one vertical voltage line VLv may be greater than an area of the first auxiliary common voltage line VSSLva. For example, the area of the vertical voltage line VLv may be about two or about four times the area of the first auxiliary common voltage line VSSLva.

The vertical common voltage line VSSLv, the first vertical voltage line VILv, the second vertical voltage line VAIL1$v$, and the third vertical voltage line VAIL2$v$ may be sequentially repeatedly arranged in the second direction (e.g., the x direction). However, one or more embodiments are not limited thereto, and an arrangement order of the vertical common voltage line VSSLv, the first vertical voltage line VILv, the second vertical voltage line VAIL1$v$, and the third vertical voltage line VAIL2$v$ may be variously changed depending on the design.

Figure 14:
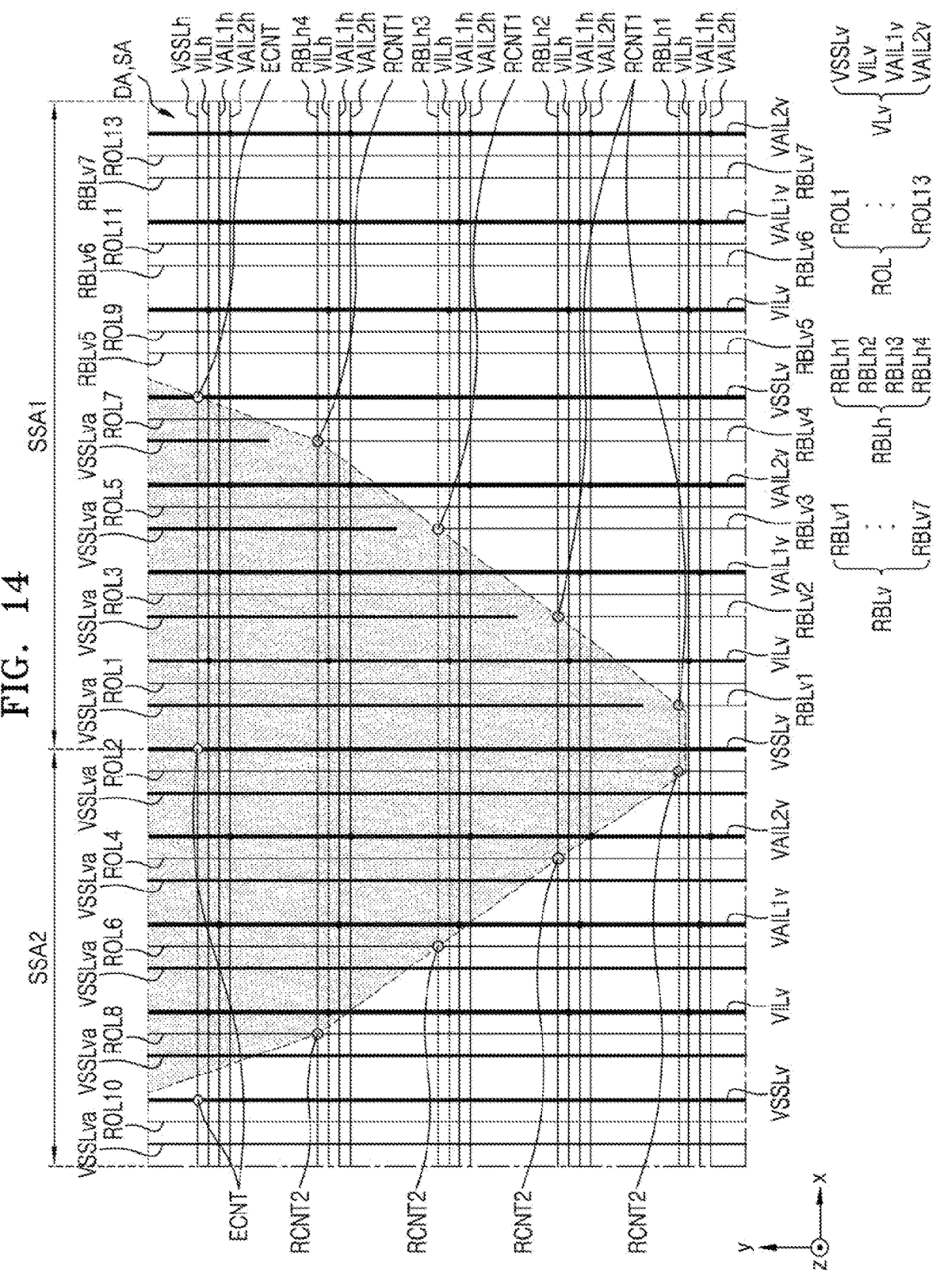
FIGS. 14 and 15 are diagrams schematically illustrating lines of a display apparatus according to one or more embodiments.
Figure 15:
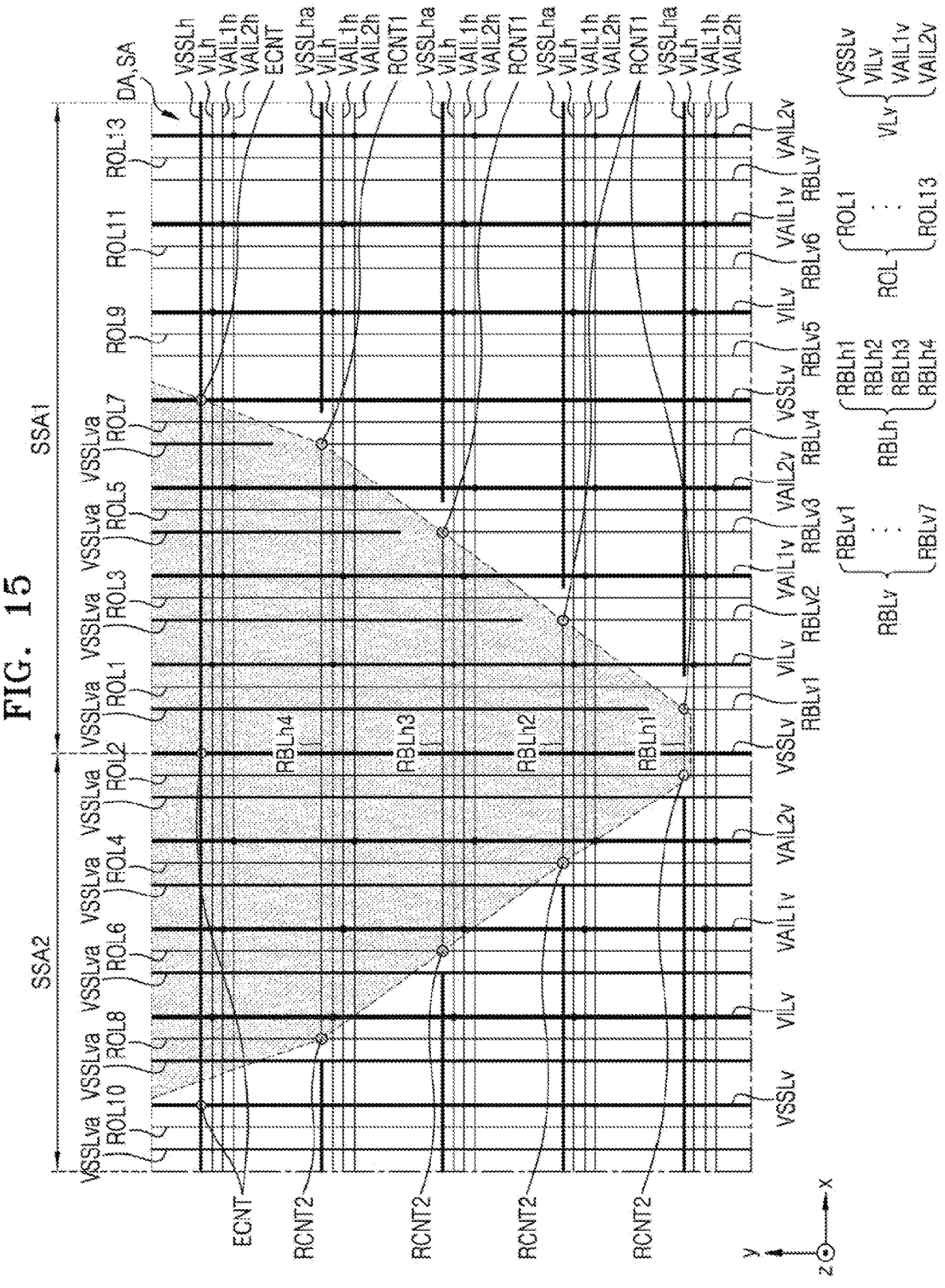

FIGS. 14 and 15 are diagrams schematically illustrating lines of a display apparatus according to one or more embodiments. FIGS. 14 and 15 show a case in which one vertical connection line RBLv or one vertical common voltage line VSSLv is arranged between adjacent vertical voltage lines VLv, as described with reference to FIG. 13A.

Referring to FIG. 14, the display area DA may include the light detection area SA, and the light detection area SA may include the first sub-detection area SSA1 and the second sub-detection area SSA2.

The vertical voltage lines VLv each extending in the first direction (e.g., the y direction) may be arranged to be spaced from each other in the second direction (e.g., the x direction) across the entire surface of the display area DA. The vertical voltage lines VLv may include the vertical common voltage line VSSLv, the first vertical voltage line VILv, the second vertical voltage line VAIL1$v$, and the third vertical voltage line VAIL2$v$.

The first horizontal voltage line VILh, the second horizontal voltage line VAIL1$h$, and the third horizontal voltage line VAIL2$h$ each extending in the second direction (e.g., the x direction) may be arranged to be spaced from each other in the first direction (e.g., the y direction) across the entire surface of the display area DA. Each of the first horizontal voltage line VILh, the second horizontal voltage line VAIL1$h$, and the third horizontal voltage line VAIL2$h$ may be arranged for each pixel row including pixels arranged in the second direction (e.g., the x direction).

The first vertical voltage line VILv may be connected to the first horizontal voltage line VILh extending in the second direction (e.g., the x direction), and the first vertical voltage line VILv and the first horizontal voltage line VILh may constitute a mesh structure. The second vertical voltage line VAIL1$v$ may be connected to the second horizontal voltage line VAIL1$h$ extending in the second direction (e.g., the x direction), so as to constitute a mesh structure. The third vertical voltage line VAIL2$v$ may be connected to the third horizontal voltage line VAIL2$h$ extending in the second direction (e.g., the x direction), so as to constitute a mesh structure.

The read-out lines ROL each extending in the first direction (e.g., the y direction) may be arranged to be spaced from each other in the second direction (e.g., the x direction) across the entire surface of the light detection area SA. The first to 13$^{th}$ read-out lines ROL1 to ROL13 may be arranged in the light detection area SA. In one or more embodiments, the odd-numbered read-out lines ROL1, ROL3, . . . , and ROL 13 may be arranged in the first sub-detection area SSA1, and may be directly connected to input lines connected to a light detection driver circuit. The even-numbered read-out lines ROL2, ROL4, . . . , and ROL10 may be connected to input lines via the vertical connection lines RBLv and the horizontal connection lines RBLh.

In the first sub-detection area SSA1, the vertical connection lines RBLv and the first auxiliary common voltage lines VSSLva each extending in the first direction (e.g., the y direction) may be arranged to be spaced from each other in the second direction (e.g., the x direction). Each of the first auxiliary common voltage lines VSSLva may have the same extension axis as a corresponding vertical connection line RBLv, and may be separated by being spaced from the corresponding vertical connection line in the first direction (e.g., the y direction). For example, an upper (+y direction) end of the first vertical connection line RBLv1 may be separated by being spaced from a lower (−y direction) end of the first auxiliary common voltage line VSSLva having the same axis as the first vertical connection line RBLv1.

In the second sub-detection area SSA2, the first auxiliary common voltage lines VSSLva each extending in the first direction (e.g., the y direction) may be arranged to be spaced from each other in the second direction (e.g., the x direction).

The horizontal common voltage lines VSSLh and the horizontal connection lines RBLh each extending in the second direction (e.g., the x direction) may be arranged to be spaced from each other in the first direction (e.g., the y direction) across the entire surface of the display area DA.

For each pixel circuit row including pixel circuits arranged in the second direction (e.g., the x direction), any one of the horizontal common voltage lines VSSLh and the horizontal connection lines RBLh may be arranged. For example, the first horizontal connection line RBLh1 may be arranged in the first pixel circuit row, the second horizontal connection line RBLh2 may be arranged in the second pixel circuit row, the third horizontal connection line RBLh3 may be arranged in the third pixel circuit row, the fourth horizontal connection line RBLh4 may be arranged in the fourth pixel circuit row, and the horizontal common voltage line VSSLh may be arranged in the fifth pixel circuit row.

The horizontal connection lines RBLh may connect the vertical connection lines RBLv arranged in the first sub-detection area SSA1 to the read-out lines ROL arranged in the second sub-detection area SSA2. For example, one end (in a +x direction) of each of the first horizontal connection line RBLh1, the second horizontal connection line RBLh2, the third horizontal connection line RBLh3, and the fourth horizontal connection line RBLh4 may be electrically connected via the fifth contact hole RCNT1 to the first vertical connection line RBLv1, the second vertical connection line RBLv2, the third vertical connection line RBLv3, and the fourth vertical connection line RBLv4, and the other end (in a −x direction) of each of the first horizontal connection line RBLh1, the second horizontal connection line RBLh2, the third horizontal connection line RBLh3, and the fourth horizontal connection line RBLh4 may be electrically connected via the sixth contact hole RCNT2 to the second read-out line ROL2, the fourth read-out line ROL4, the sixth read-out line ROL6, and the eighth read-out line ROL8.

The horizontal common voltage lines VSSLh may be electrically connected to the vertical common voltage lines VSSLv arranged in the display area DA through the seventh contact hole ECNT. The horizontal common voltage lines VSSLh and the vertical common voltage lines VSSLv may cross each other and constitute a mesh structure.

Referring to FIG. 15, the second auxiliary common voltage line VSSLha extending in the second direction (e.g., the x direction) may be arranged in the display area DA.

Each of the horizontal connection lines RBLh may be arranged between a corresponding vertical connection line RBLv and a corresponding read-out line ROL. For example, the first horizontal connection line RBLh1 may be arranged between the first vertical connection line RBLv1 and the second read-out line ROL2, the second horizontal connection line RBLh2 may be arranged between the second vertical connection line RBLv2 and the fourth read-out line ROL4, the third horizontal connection line RBLh3 may be arranged between the third vertical connection line RBLv3 and the sixth read-out line ROL6, and the fourth horizontal connection line RBLh4 may be arranged between the fourth vertical connection line RBLv4 and the eighth read-out line ROL8.

One end (in a +x direction) of each of the first horizontal connection line RBLh1, the second horizontal connection line RBLh2, the third horizontal connection line RBLh3, and the fourth horizontal connection line RBLh4 may be electrically connected via the fifth contact hole RCNT1 to the first vertical connection line RBLv1, the second vertical connection line RBLv2, the third vertical connection line RBLv3, and the fourth vertical connection line RBLv4, and the other end (in a −x direction) of each of the first horizontal connection line RBLh1, the second horizontal connection line RBLh2, the third horizontal connection line RBLh3, and the fourth horizontal connection line RBLh4 may be electrically connected via the sixth contact hole RCNT2 to the second read-out line ROL2, the fourth read-out line ROL4, the sixth read-out line ROL6, and the eighth read-out line ROL8.

Each of the second auxiliary common voltage lines VSSLha may have the same extension axis as a corresponding horizontal connection line RBLh, and may be separated by being spaced from the corresponding horizontal connection line RBLh in the second direction (e.g., the x direction). In one or more embodiments, two second auxiliary common voltage lines VSSLha having the same extension axis as the horizontal connection line RBLh may be arranged at opposite sides of the horizontal connection line RBLh with one horizontal connection line RBLh therebetween. For example, a left (−x direction) end of the first horizontal connection line RBLh1 may be separated by being spaced from a right (+x direction) end of the second auxiliary common voltage line VSSLha having the same extension axis as the first vertical connection line RBLv1. A right (+x direction) end of the first horizontal connection line RBLh1 may be separated by being spaced from a left (−x direction) end of the second auxiliary common voltage line VSSLha having the same extension axis as the first vertical connection line RBLv1.

The common voltage ELVSS (see FIG. 4) may be applied to the second auxiliary common voltage line VSSLha. Accordingly, when lines not used as the horizontal connection lines RBLh are used as the second auxiliary common voltage lines VSSLha, a voltage drop phenomenon of the common voltage ELVSS (see FIG. 4) may be prevented or reduced, so that a display apparatus on which a high-quality image is displayed may be implemented.

According to one or more embodiments configured as described above, a difference in luminance due to a voltage drop may be reduced so that a display apparatus on which a high-quality image is displayed may be implemented. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a light-emitting diode in a display area and a pixel circuit electrically connected to the light-emitting diode;
   a photo diode in a light detection area overlapping the display area, and a light detection circuit electrically connected to the photo diode;
   a read-out line overlapping the light detection circuit and extending in a first direction;
   a vertical connection line extending in the first direction in the display area;
   a horizontal connection line extending in a second direction crossing the first direction in the display area, and connecting the vertical connection line to the read-out line; and
   a vertical voltage line extending in the first direction in the display area and having a width in the second direction greater than a width in the second direction of the vertical connection line.

2. The display apparatus of claim 1, wherein the vertical connection line comprises a plurality of vertical connection lines and the vertical voltage line comprises a plurality of vertical voltage lines, and at least one vertical connection line of the plurality of vertical connection lines is arranged between neighboring vertical voltage lines of the plurality of the vertical voltage lines.

3. The display apparatus of claim 2, wherein two vertical connection lines of the plurality of vertical connection lines are arranged between the neighboring vertical voltage lines of the plurality of vertical voltage lines.

4. The display apparatus of claim 2, wherein the pixel circuit comprises:

a driving transistor comprising a first terminal, a second terminal, and a gate connected to a first node;

a data write transistor connected to the first terminal of the driving transistor and a data line;

a first initialization transistor connected to the first node and a first horizontal voltage line; and a second initialization transistor connected to a pixel electrode of the light-emitting diode and to a second horizontal voltage line or a third horizontal voltage line, wherein the plurality of vertical voltage lines comprises a first vertical voltage line connected to the first horizontal voltage line, a second vertical voltage line connected to the second horizontal voltage line, and a third vertical voltage line connected to the third horizontal voltage line, and a vertical common voltage line.

5. The display apparatus of claim 4, further comprising a horizontal common voltage line extending in the second direction in the display area and connected to the vertical common voltage line.

6. The display apparatus of claim 5, wherein the horizontal connection line and the horizontal common voltage line are on a first conductive layer, and the plurality of vertical connection lines and the plurality of vertical voltage lines are on a second conductive layer that is on the first conductive layer.

7. The display apparatus of claim 1, wherein the vertical connection line is located to be farther away from an imaginary center line than the read-out line connected to the vertical connection line is, the imaginary center line dividing the display area into two equal areas and extending in the first direction.

8. The display apparatus of claim 1, further comprising:

a data line extending in the first direction in the display area and connected to the pixel circuit;

a vertical data connection line extending in the first direction in the display area; and a horizontal data connection line extending in the second direction in the display area and connecting the data line to the vertical data connection line.

9. The display apparatus of claim 8, wherein the vertical data connection line is located to be closer to an imaginary center line than the data line connected to the vertical data connection line is, the imaginary center line dividing the display area into two equal areas and extending in the first direction.

10. The display apparatus of claim 8, wherein the display area comprises a first area in which the horizontal data connection line is arranged, and a second area in which the horizontal connection line is arranged, and wherein the first area and the second area do not overlap each other.

11. The display apparatus of claim 1, wherein the pixel circuit comprises a plurality of pixel circuits and the light detection circuit comprises a plurality of light detection circuits, and wherein at least two pixel circuits of the plurality of pixel circuits are arranged between light detection circuits of the plurality of light detection circuits neighboring in the second direction.

12. The display apparatus of claim 11, wherein four pixel circuits of the plurality of pixel circuits are arranged between light detection circuits of the plurality of light detection circuits neighboring in the second direction.

13. The display apparatus of claim 11, wherein the vertical connection line or the vertical voltage line is arranged between two pixel circuits of the plurality of pixel circuits in contact with each other in the second direction.

14. The display apparatus of claim 1, wherein the vertical voltage line comprises a first portion having a first width and a second portion having a second width that is greater than the first width.

15. The display apparatus of claim 14, wherein an area of the vertical voltage line is two to four times an area of the vertical connection line.

16. The display apparatus of claim 1, further comprising a plurality of first auxiliary common voltage lines extending in the first direction in the light detection area.

17. The display apparatus of claim 16, wherein the vertical voltage line comprises a plurality of vertical voltage lines, and wherein at least one first auxiliary common voltage line of the plurality of first auxiliary common voltage lines is arranged between neighboring vertical voltage lines of the plurality of the vertical voltage lines.

18. The display apparatus of claim 17, further comprising a plurality of second auxiliary common voltage lines each extending in the second direction in the display area, wherein some second auxiliary common voltage lines of the plurality of second auxiliary common voltage lines have a same extension axis as a corresponding horizontal connection line, but are spaced from the corresponding horizontal connection line in the second direction.

19. The display apparatus of claim 16, wherein the vertical connection line comprises a plurality of vertical connection lines, and wherein the light detection area comprises a first line area in which the plurality of first auxiliary common voltage lines are arranged, and a second line area in which the plurality of vertical connection lines are arranged.

20. The display apparatus of claim 19, wherein some first auxiliary common voltage lines of the plurality of first auxiliary common voltage lines have a same extension axis as a corresponding vertical connection line, and are spaced from the corresponding vertical connection line in the first direction.

* * * * *